United States Patent [19]

Iizuka

[11] Patent Number: 5,745,150
[45] Date of Patent: Apr. 28, 1998

[54] LASER DRAWING APPARATUS HAVING DRAWING BEAMS IN A COMMON PLACE ALIGNED WITH A LENS MERIDIAN

[75] Inventor: Takashi Iizuka, Tokyo, Japan

[73] Assignee: Asahi Kogaku Kogyo Kabushiki Kaisha, Tokyo, Japan

[21] Appl. No.: 279,747

[22] Filed: Jul. 22, 1994

[30] Foreign Application Priority Data

Aug. 11, 1993 [JP] Japan .................. 5-199465

[51] Int. Cl.⁶ .................. B41J 2/47; G01D 15/14; G02B 26/00; G02B 27/00
[52] U.S. Cl. .................. 347/242; 342/243
[58] Field of Search .................. 347/239, 255, 347/241, 242, 243, 257, 256

[56] References Cited

U.S. PATENT DOCUMENTS 4,760,407  7/1988  Arimoto et al. .................. 347/241
5,379,059  1/1995  Winsor .................. 347/255
5,386,221  1/1995  Allen et al. .................. 347/239

Primary Examiner—Benjamin R. Fuller
Assistant Examiner—Raquel Yvette Gordon
Attorney, Agent, or Firm—Kane,Dalsimer,Sullivan,Kurucz, Levy, Eisele and Richard, LLP

[57] ABSTRACT

A laser drawing apparatus including a splitting means for splitting laser light emitted from a laser source into groups of drawing beams, the drawing beams being aligned in a common plane; a lens to which said drawing beams are made incident upon; and a scanning means for scanning a drawing surface with the said drawing beams passed through the lens in a main scanning direction; wherein the laser source and the splitting means are arranged in a manner such that the drawing beams in the common plane are alinged on a meridian of the lens, and the drawing beams are made incident upon the lens as linearly polarized light having a direction of oscillation which is parallel with or normal to the meridian of the lens.

6 Claims, 23 Drawing Sheets

LASER DRAWING APPARATUS HAVING DRAWING BEAMS IN A COMMON PLACE ALIGNED WITH A LENS MERIDIAN

BACKGROUND OF THE INVENTION

1. Field of the Invention

The present invention relates to a laser drawing apparatus which is adapted, for example, to form a predetermined pattern of circuit on a circuit board.

2. Description of the Related Art

In a known method of forming a circuit pattern on a circuit board (i.e., substrate), a photopolymer or the like is uniformly applied to the substrate coated with a thin film layer of electrically conductive metal, such as copper. Thereafter, the substrate is illuminated with ultraviolet light, for example, while masking the substrate with an exposing and printing photomask (photomask film) having a predetermined shape, so that a circuit pattern corresponding to the photomask is formed on the substrate. The exposed photopolymer on the substrate is dissolved by a solvent and is subjected to a predetermined treatment by chemicals in liquid state so that the exposed conductive metal is corroded. No corrosion occurs at the portion of the substrate on which the non-exposed photopolymer layer remains. Hence, the same circuit pattern as the photomask pattern is formed on the substrate.

However, in the known manufacturing method as mentioned above, it requires long time and a number of processes to examine the photomask. Furthermore, it is necessary not only to create an environment for the photomask in which the temperature and humidity are kept constant to thereby prevent the photomask from being thermally contracted or expanded, but also to protect the photomask from dust or possible damaged. Consequently, maintenance of the photomask is troublesome.

It is also known to directly draw (i.e., expose) the circuit pattern on the substrate using a scanning laser beam with which the substrate is scanned with the help of, for example, a polygonal mirror, without using an exposing and printing photomask. In this method, the above-mentioned drawbacks in the manufacturing method in which the photomask is employed can be eliminated. However, another problem exists due to a difference in reflectance of the lens provided between the laser source which emits the laser beam and the substrate for different polarization components of the laser beam when the substrate is scanned with the laser beam, as discussed below.

When the laser beam is transmitted through the lens at the center optical axis thereof, there is no problem. However, when the laser beam passes through a portion of the lens other than the center optical axis thereof, the laser beam emitted from the lens will be deviated or twisted with respect to the incident beam upon the lens, due to the difference in reflectance between different polarization components of the laser beam. This results in a reduction of the quantity of light emitted from the lens.

SUMMARY OF THE INVENTION

The primary object of the present invention is to provide a laser drawing apparatus in which the direction of oscillation of the light incident upon the lens is appropriately specified so that reduction in the quantity of light to be emitted from the lens does not occur.

To achieve the object mentioned above, according to the present invention, there is provided a splitting means for splitting laser light emitted from a laser source into groups of drawing beams, the drawing beams being aligned in a common plane, a lens to which said drawing beams are made incident upon, and a scanning means for scanning a drawing surface with said said drawing beams passed through said lens in a main scanning direction, wherein said laser source and said splitting means are arranged in a manner such that said drawing beams in said common plane are alinged on a meridian of said lens, and said drawing beams are made incident upon said lens as linearly polarized light having a direction of oscillation which is parallel with or normal to said meridian of said lens.

With this arrangement, not only can the direction of oscillation of the split beams emitted from the lens be appropriately specified, but also no decrease in the quantity of light to be transmitted through the lens occurs.

Preferably, the splitting means comprises a beam splitter which separates the laser light into two beams and a beam separator which separates each of two beams into two groups of drawing beams, each of the two groups of drawing beams being aligned in a common plane. The beam separator is supported in such a manner that said beam separator is swingable about an axis extending parallel to the drawing beams in said common plane.

Furthermore, it is preferable that an acoustooptic modulator which independently controls the emission of the groups of drawing beams transmitted through the lens and incident on the acoustooptic modulator in accordance with predetermined data to provide ON/OFF drawing data to the respective groups of drawing beams. The lens are arranged along an optical path of the drawing beams and receive the drawing beams, and the lens comprises an adjusting means for moving the pitch of the drawing beams to match a pitch of the acoustooptic modulator.

The adjusting means may comprise a base portion secured to a table of the laser drawing apparatus, and a movable portion which is movable with respect to the base portion and which supports the lens.

The present disclosure relates to subject matter contained in Japanese patent application No. 5-199465 (filed on Aug. 11, 1993) which is expressly incorporated herein by reference in its entirety.

BRIEF DESCRIPTION OF THE DRAWINGS

The invention will be described below in detail with reference to the accompanying drawings.

DESCRIPTION OF THE PREFERRED EMBODIMENT

Figure 1:
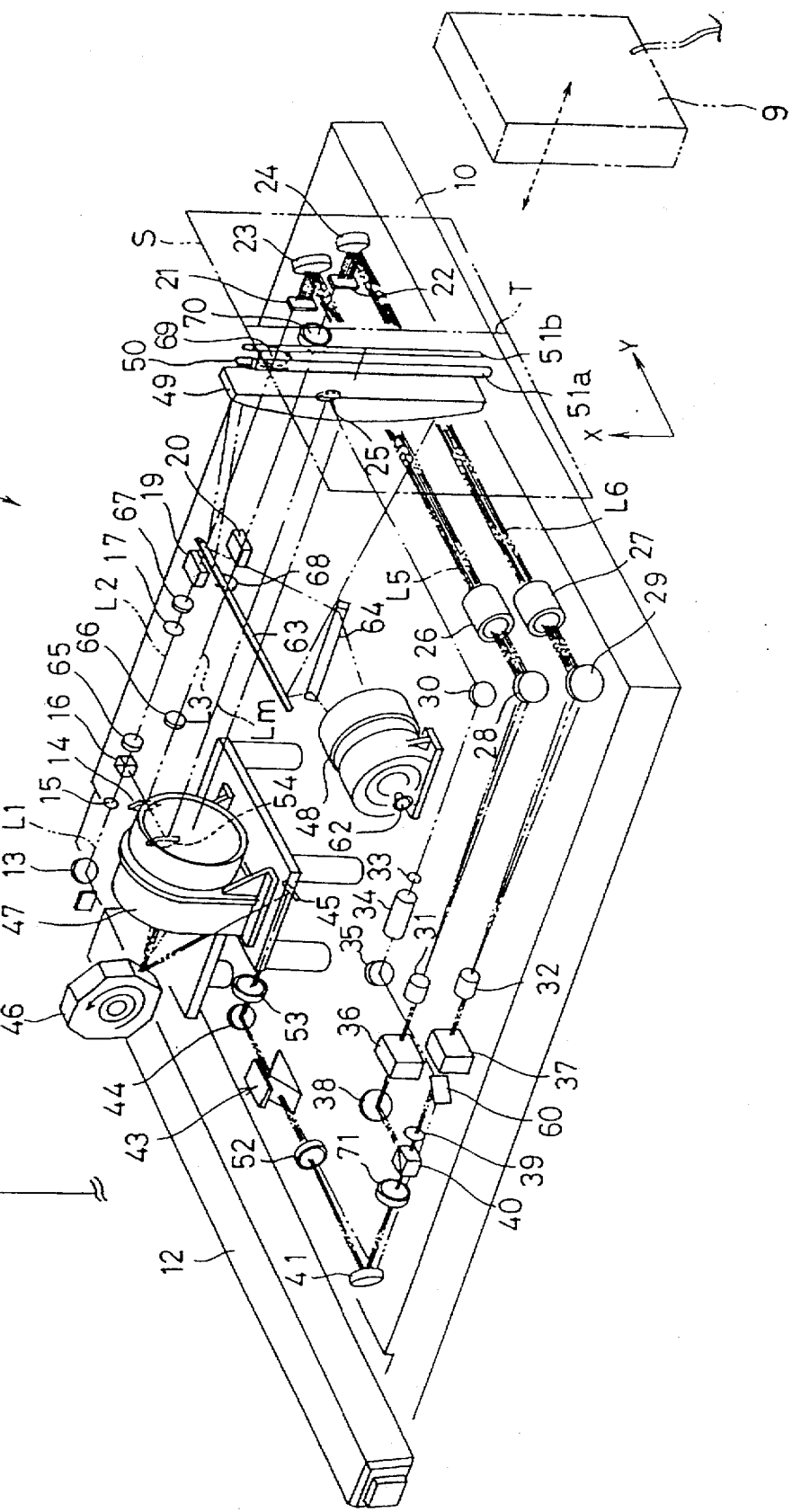
FIG. 1 is a perspective view of a laser drawing apparatus according to the present invention.
Figure 2:
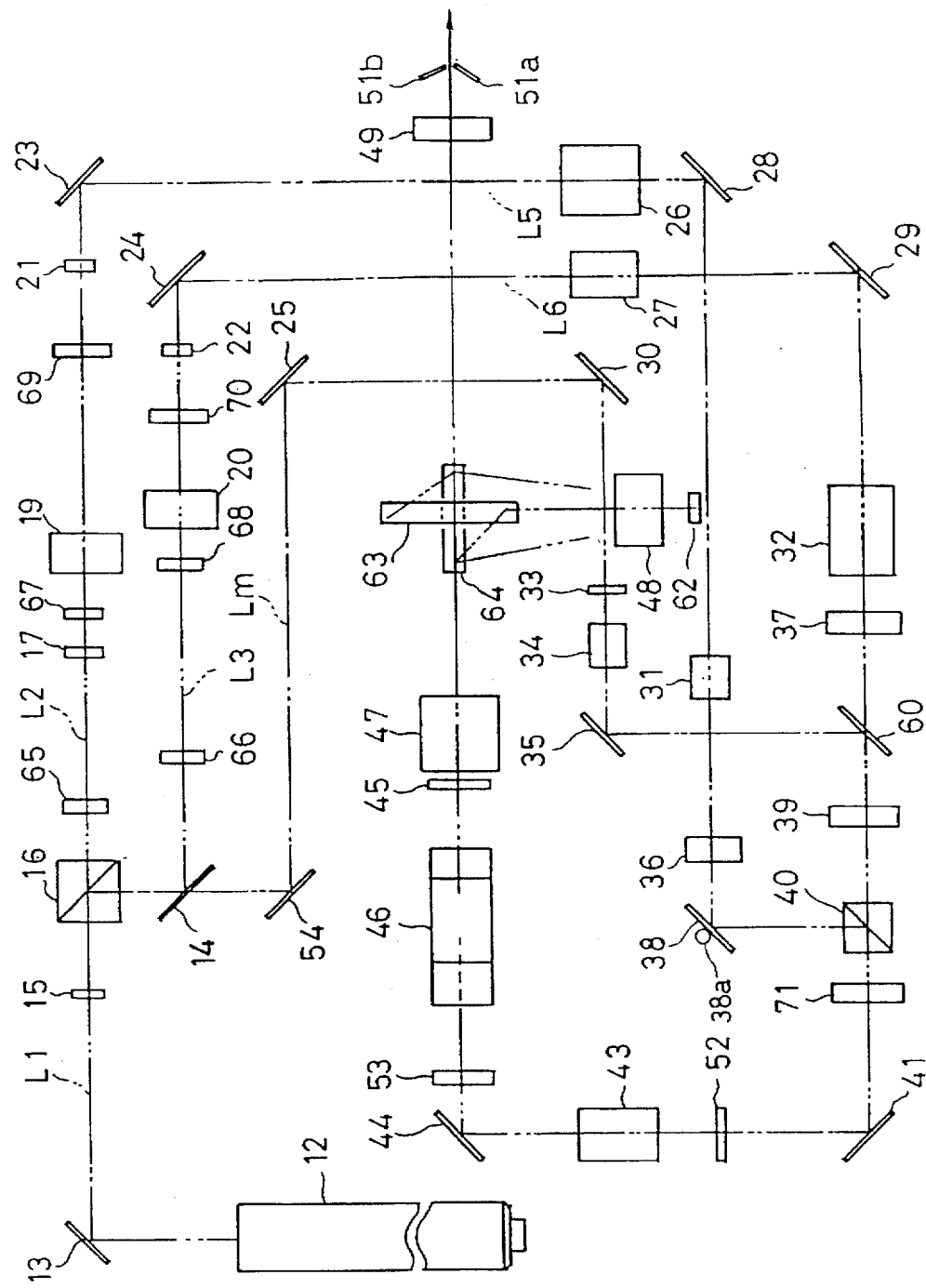
FIG. 2 is a schematic plan view of a laser drawing apparatus shown in FIG. 1.
Figure 3:
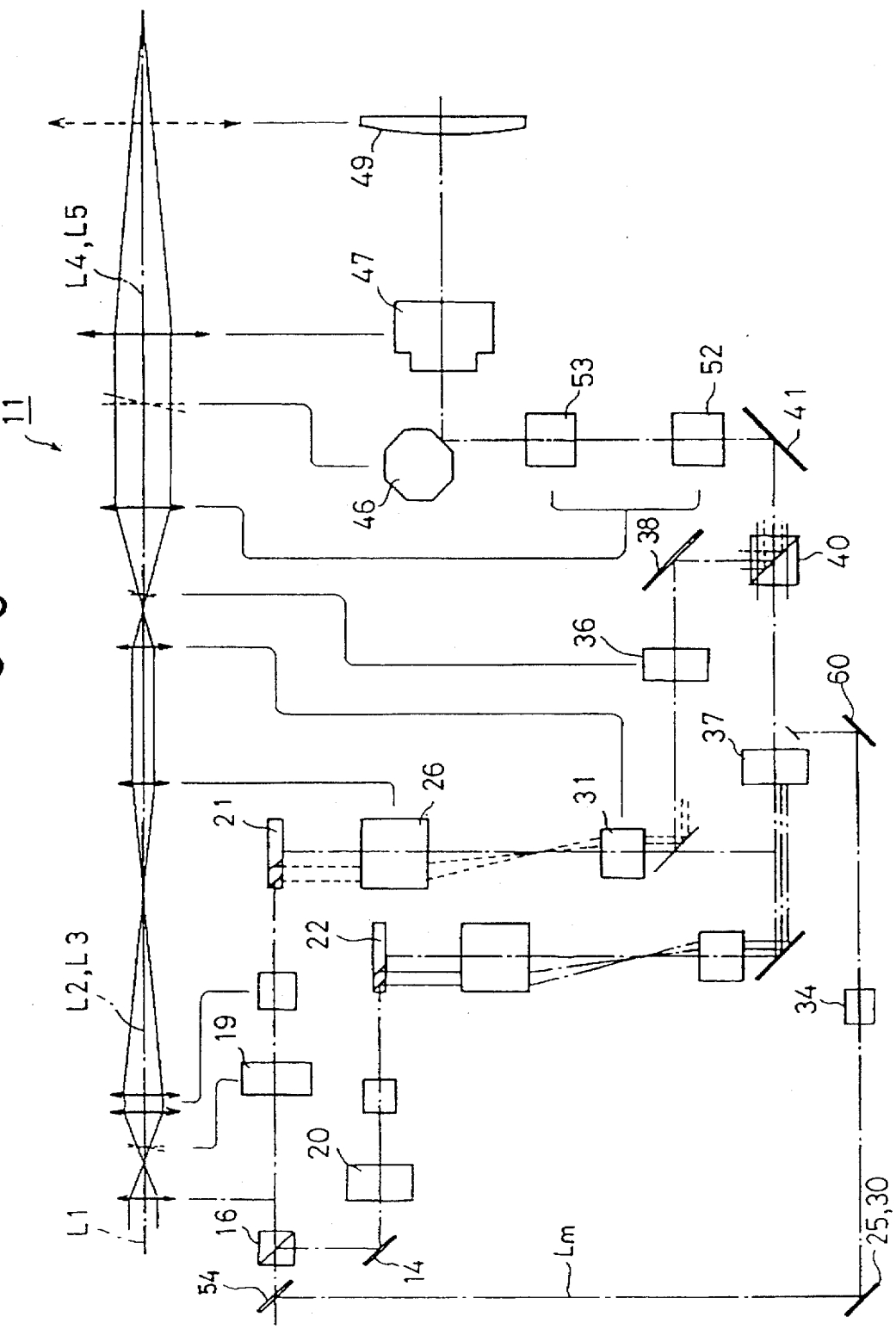
FIG. 3 is a schematic plan view of main components of a laser drawing apparatus shown in FIG. 1.

FIGS. 1 and 2 are a perspective view and a schematic plan view of a laser drawing apparatus to which the present invention is applied, respectively, and FIG. 3 is a schematic plan view of main components of a laser drawing apparatus shown in FIGS. 1 and 2.

The laser drawing apparatus 11 includes an argon laser (Ar laser) unit 12, beam benders 13, 23–25, 28–30, 35, 41, 44, 45 and 54, adjusting targets 15, 17 and 33, a half prism 16, a beam bender (half mirror) 14, and lenses 52, 53, 65, 71, on a table 10. The laser drawing apparatus 11 further includes acoustooptic modulators 19 and 20, beam separators 21 and 22, pitch changing convergent optical systems 26, 31, 27 and 32, acoustooptic modulators of 8 channels 36 and 37, a beam bender 38, a condenser optical system 34, a λ/2 plate 39, a polarization beam splitter 40, an image rotator 43, a polygonal mirror 46, an fθ lens 47, a gathering lens 48 for an X-scale, a condenser lens 49, an X-scale 50, a mirror 60, monitoring mirrors 51a and 51b, and a photo detector 62 for the X-scale. The adjusting targets 15, 17 and 33 are reference marks which are adapted to confirm optical paths of groups of beams L2 and L3 and monitoring beam Lm when the Ar laser device 12 is exchanged.

There is a substrate setting device (not shown) in the vicinity of the laser drawing apparatus 11 to form a substrate S on a drawing table surface T (indicated at a two-dotted and dashed line) corresponding to an image surface. The substrate setting device is provided with a Y-table (not shown) which is movable in the Y-direction (i.e., sub-scanning direction of the polygonal mirror 46 corresponding to the transverse direction in FIG. 1) and a swing mechanism (not shown) which swings about a rotational shaft (not shown) in the vertical direction in FIG. 1.

Figure 14:
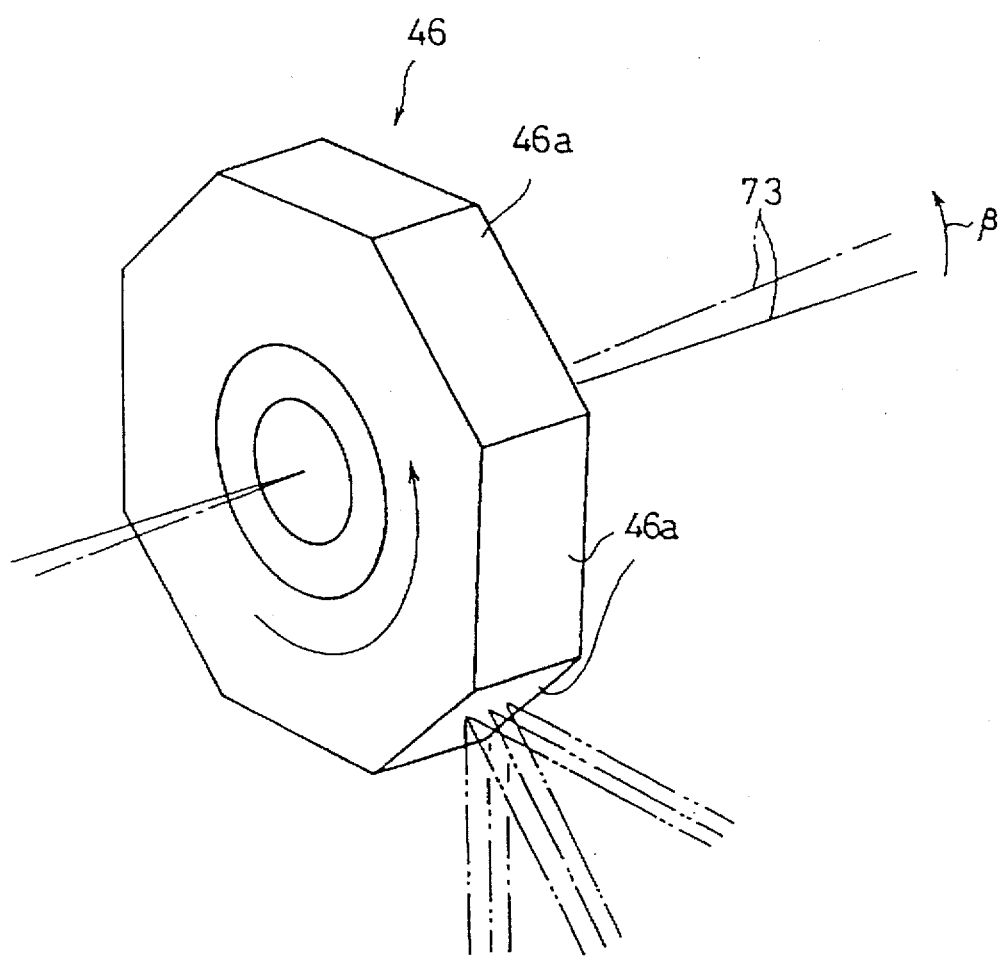
FIG. 14 is an enlarged perspective view of a polygonal mirror.

The Ar laser (i.e., laser source) 12 is a water-cooled type having an output of 1.8 W which emits laser beam L1 whose wavelength is 488 nm. The acoustooptic modulators 19 and 20 adjust the quantity(power) of beams L2 and L3 which are split by the half prism 16, so that the quantities of the beams L2 and L3 are identical. The acoustooptic modulators 19 and 20 also carry out the fine adjustment of the inclination of the reflecting surfaces 46a (FIG. 14) of the polygonal mirror 46 in accordance with data on the inclination of each reflecting surface 46a, stored in a memory (not shown) of a control means 8. To prevent the acoustooptic modulators 19 and 20 from being broken due to an excess quantity of light received thereby, the slit beams L2 and L3 which are obtained by splitting the laser beam L1 are made incident upon the acoustooptic modulators 19 and 20.

Figure 6:
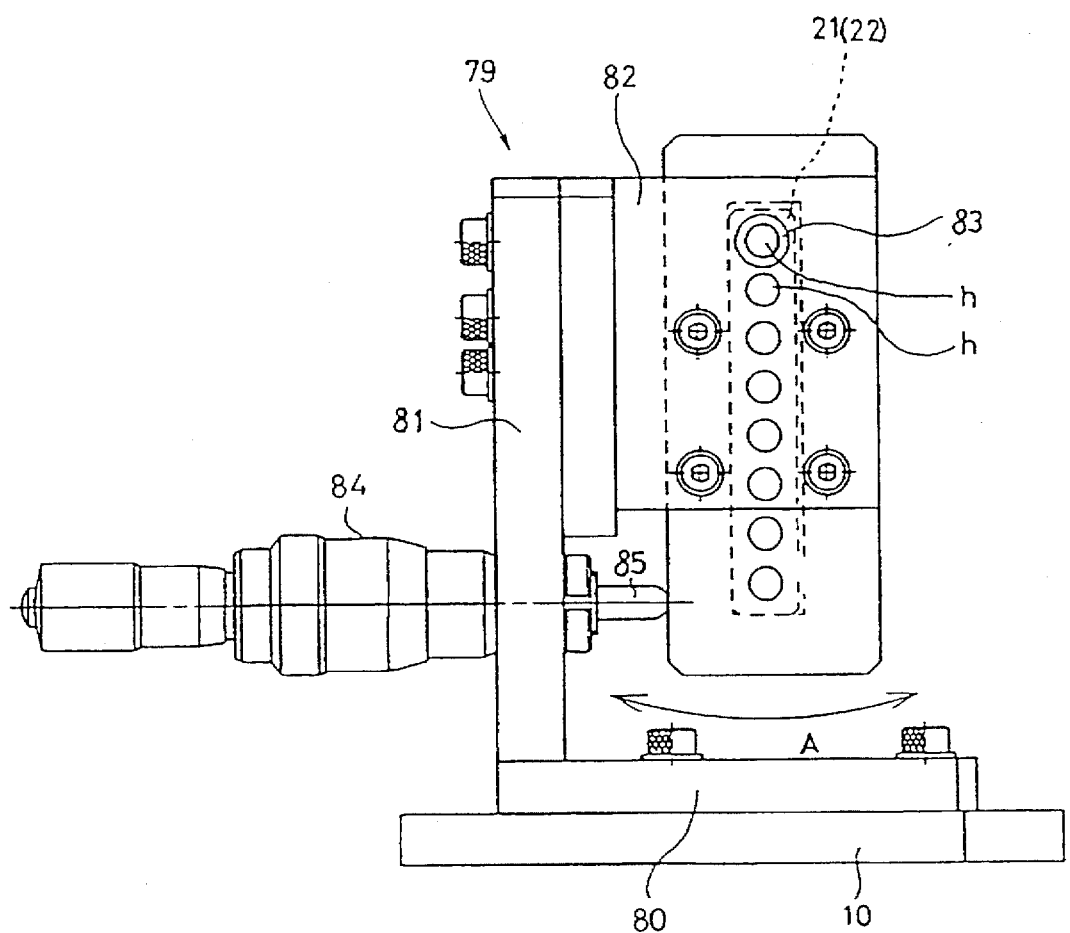
FIG. 6 is a front elevational view of a swing adjusting mechanism which rotates a beam separator.
Figure 7:
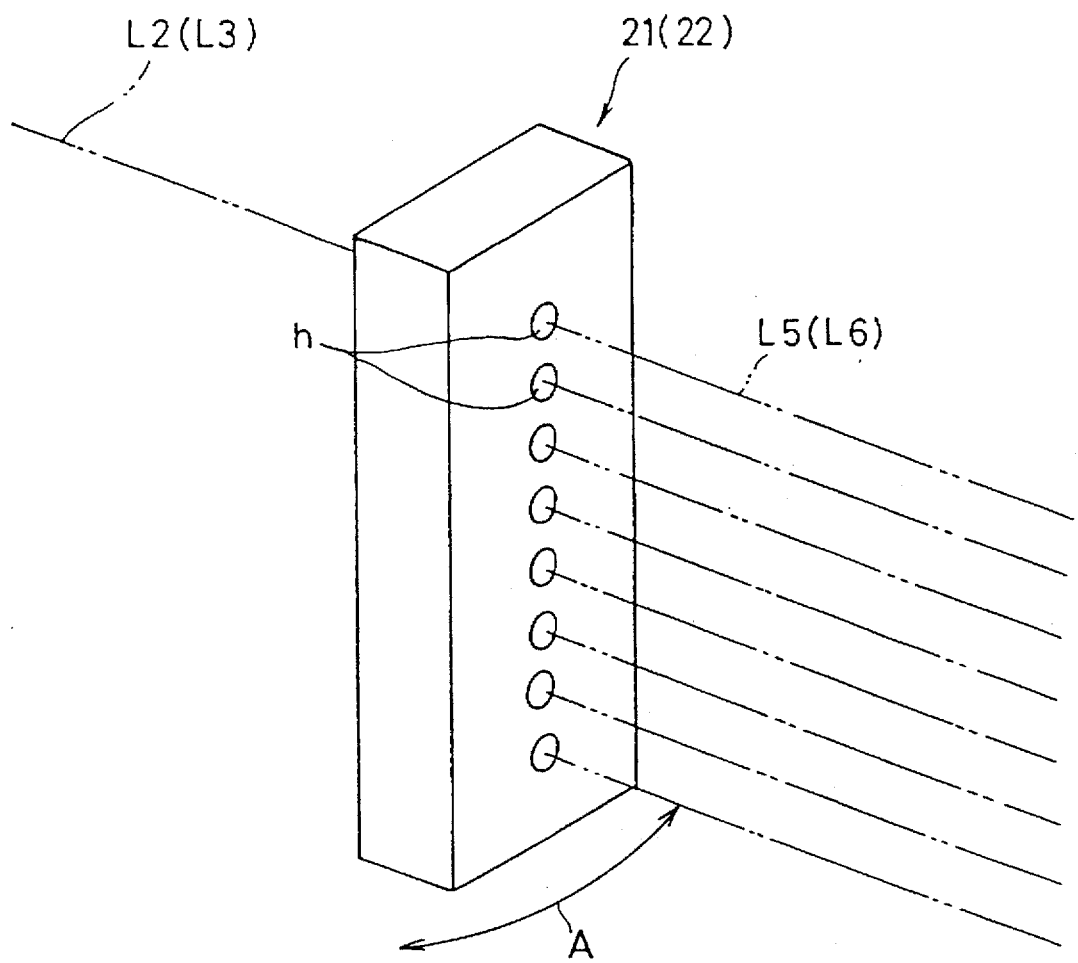
FIG. 7 is an enlarged perspective view of a beam separator in a laser drawing apparatus shown in FIG. 1.
Figure 8:
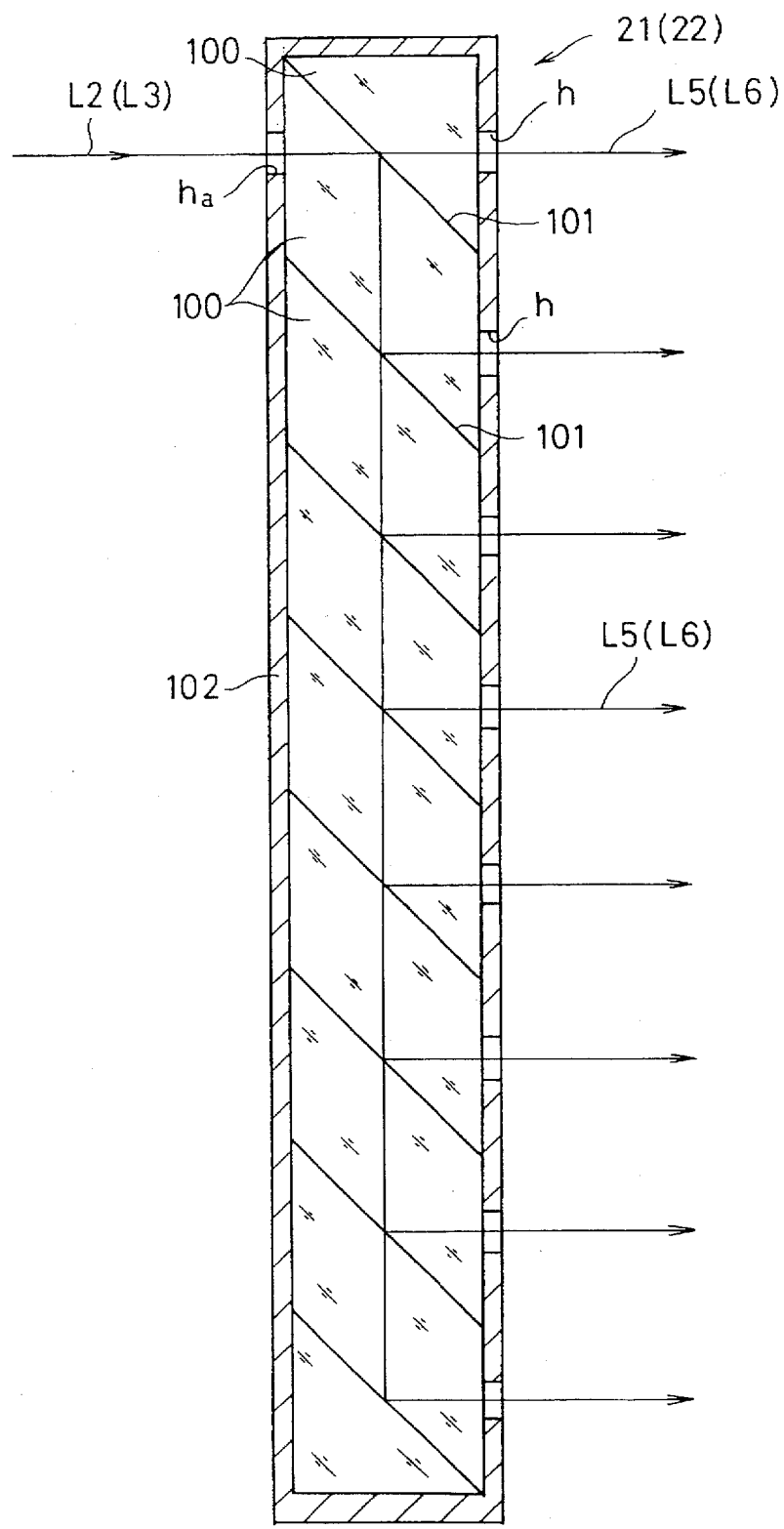
FIG. 8 is a sectional view of a beam separator shown in FIG. 1.

The beams L2 and L3 emitted from the acoustooptic modulators 19 and 20 are made incident upon the beam separators 21 and 22 in which the beams L2 and L3 are respectively split into 8 first drawing beams L5 and 8 second drawing beams L6. As can be seen in FIGS. 6 through 8, the beam separators 21 and 22 are respectively provided with 8 emission holes "h" aligned in the longitudinal direction (i.e., vertical direction in FIG. 6). The beam separators 21 and 22 are swingably supported by the swing adjusting mechanism 79 (FIG. 6) to rotate in the direction indicated at an arrow A in FIGS. 6 and 7 (i.e., direction perpendicular to the optical path of the first and second beams L5 and L6) about respective pivot shafts coaxial to the respective uppermost emission holes "h".

The beam separators 21 and 22 are respectively made of a plurality of optical elements 100 (FIG. 8) in the form of a plate, which are adhered to each other by an adhesive separating surfaces 101; then cut at an angle of 45° with respect to the separating surfaces; and thereafter enclosed by and in frames 102. The separating surfaces 101 partly reflect and partly transmit therethrough the beams L2 and L3 incident upon uppermost incident holes "ha" formed on the rear surfaces of the beam separators 21 and 22 to obtain groups of beams (first and second drawing beams L5 and L6) spaced at a predetermined distance.

Figure 16:
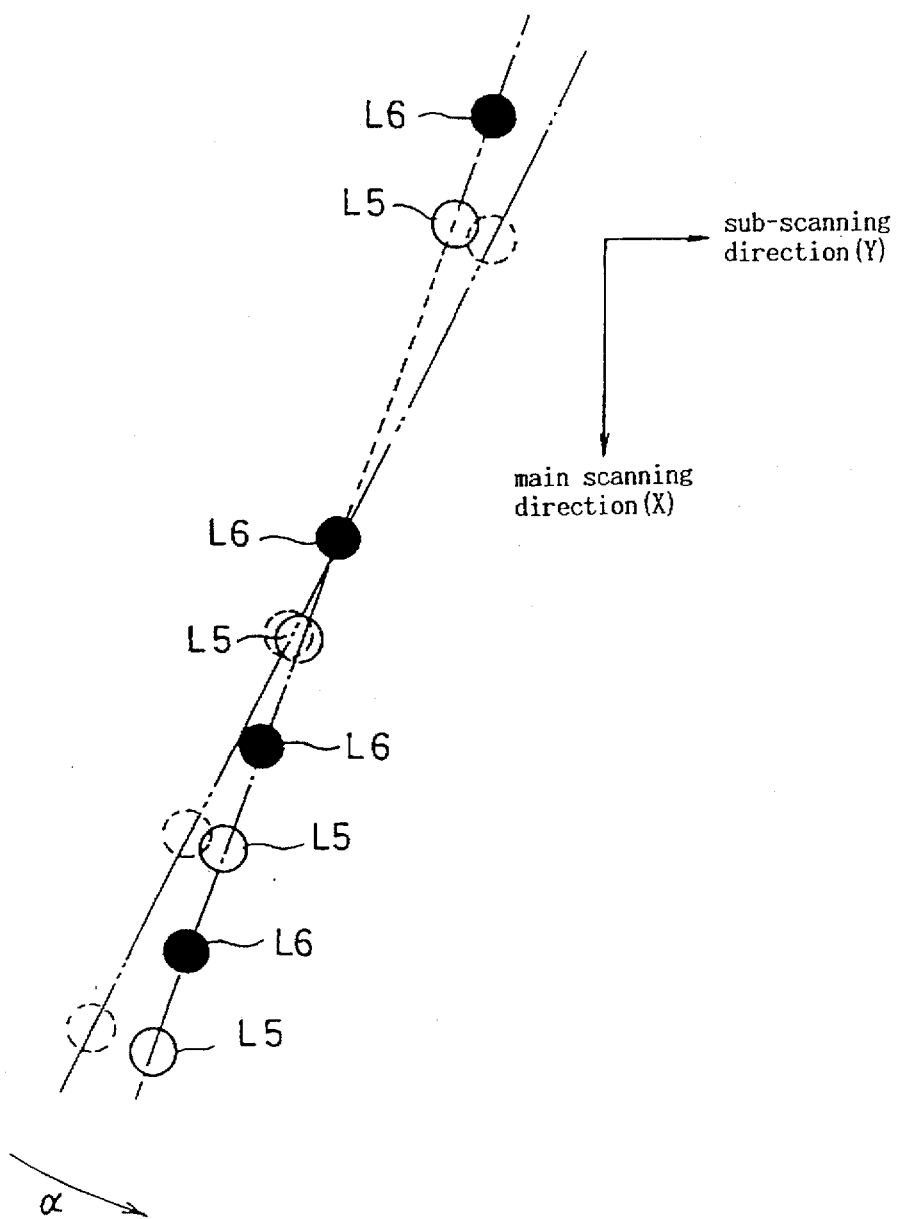
FIG. 16 is an explanatory view of two rows (i.e., bundles) of drawing beams which are rotated.

The swing adjusting mechanism 79 includes a base portion 80 secured on the table 10 of the laser drawing apparatus 11, an upright supporting wall 81 projecting upward from the base portion 80, and a bracket 82 which extends at the upper end of the supporting wall 81 in parallel with the base portion 80, as shown in FIG. 6. The supporting wall 81 is provided with a micrometer head 84 which extends in the lateral direction in FIG. 6 (i.e., Y-direction in FIG. 1). The bracket 82 is provided with a pivot shaft 83 coaxial to the uppermost emission hole "h" of the beam separator 21 (22). The beam separator 21 (22) is rotatably biased in the clockwise direction in FIG. 6 about the pivot shaft 83 by a biasing means (not shown). A spindle 85 of the micrometer head 84 abuts at the front end thereof against the lower end of the beam separator 21 (22), so that when the spindle 85 is reciprocally moved in the longitudinal axial direction thereof by the micrometer head 84, the swing movement of the beam separator 21 (22) about the pivot shaft 83 in the direction "A" takes place to rotate the aligned drawing beams L5 (L6) about the axis of the pivot shaft 83 (FIG. 16) to thereby make the drawing beams L5 and L6 parallel to each other.

The group of first drawing beams L5 emitted from the beam separator 21 is made incident upon a pair of pitch changing convergent optical systems 26 and 31. The group of second drawing beams L6 emitted from the beam separator 22 is made incident upon a pair of pitch changing convergent optical systems 27 and 32. The pitch changing convergent optical systems 26, 31 and 27, 32 change the pitches of the 8 first drawing beams L5 and the 8 second drawing beams L6, split by the beam separators 21 and 22, so that the respective pitches correspond to the pitches of the 8 channel acoustooptic modulators 36 and 37.

Figure 17:
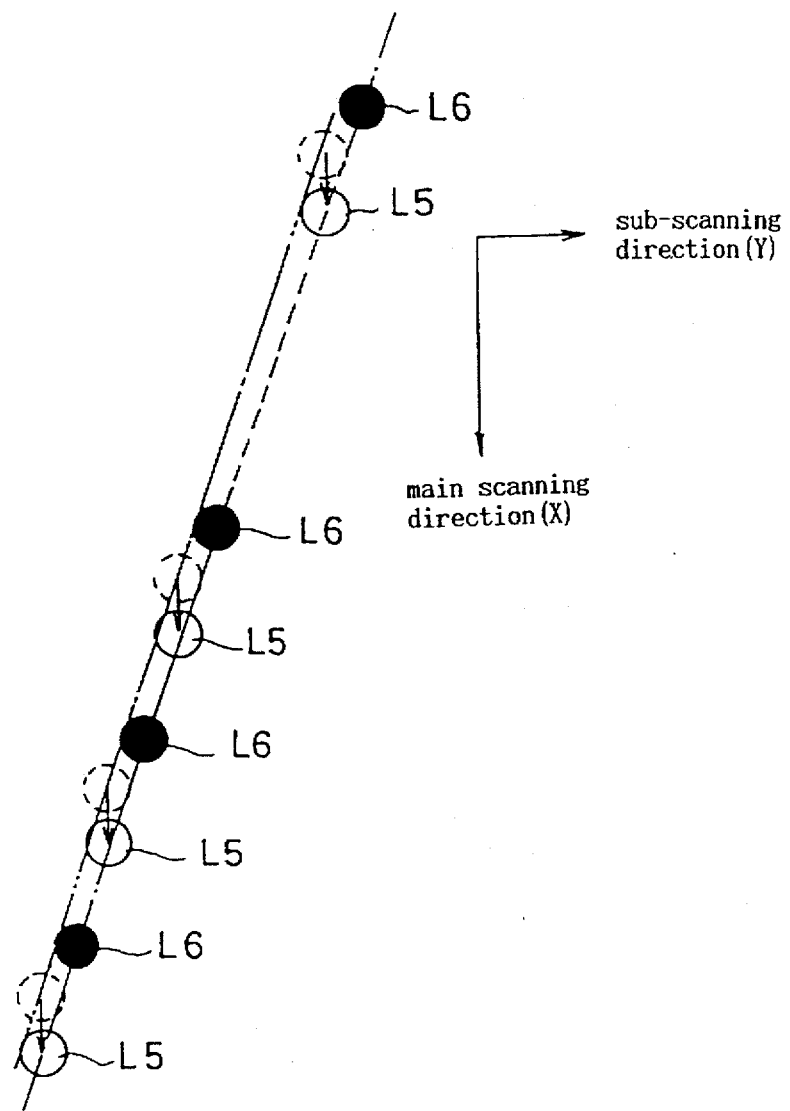
FIG. 17 is an explanatory view of one of the two rows of drawing beams which is translated in a main scanning direction of the polygonal mirror.
Figure 18:
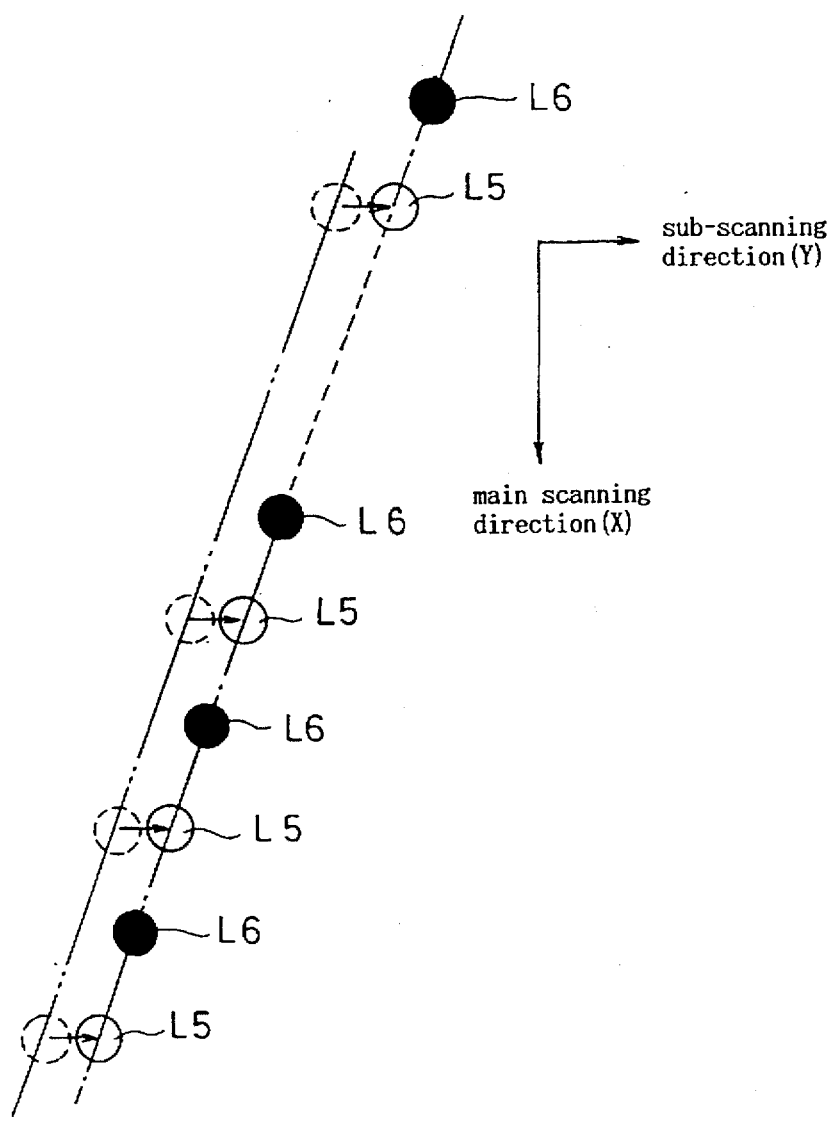
FIG. 18 is an explanatory view of one of the two rows of drawing beams which is translated in a sub-scanning direction of the polygonal mirror.

The pitch changing convergent optical systems 26 and 31 are moved and adjusted in the X-direction (FIGS. 1, 9 and 10) by the X-direction adjusting mechanism 91 (FIG. 9) to move the first group L5 of aligned drawing beams toward the second group L6 of aligned drawing beams (FIG. 17). Thus, the pitch changing convergent optical systems 26 and 31 constitute a second adjusting means to adjust the deviation of the group of beams in the direction X.

Figure 9:
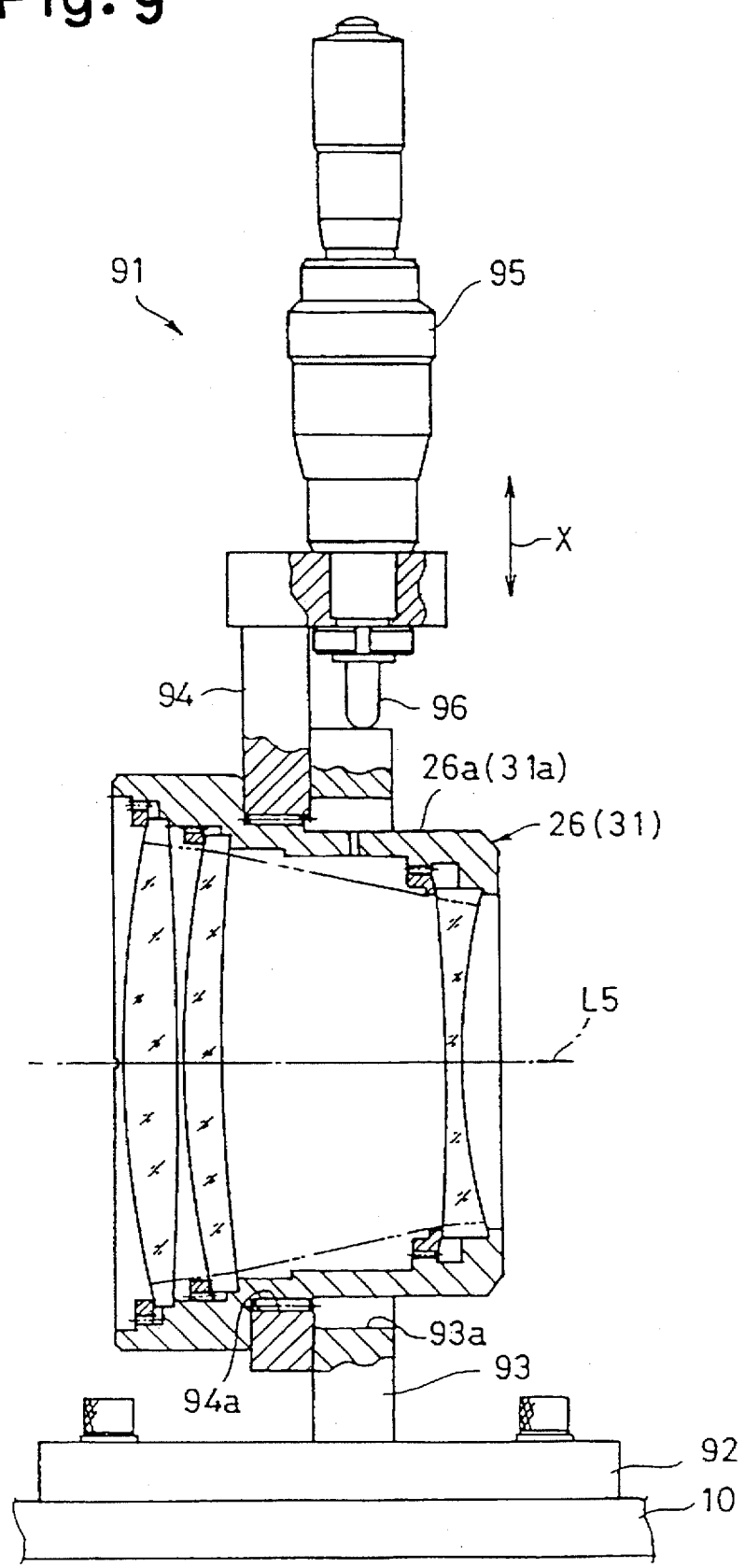
FIG. 9 is a sectional side view of an adjusting mechanism in an X-axis direction (X-direction adjusting mechanism)
Figure 10:
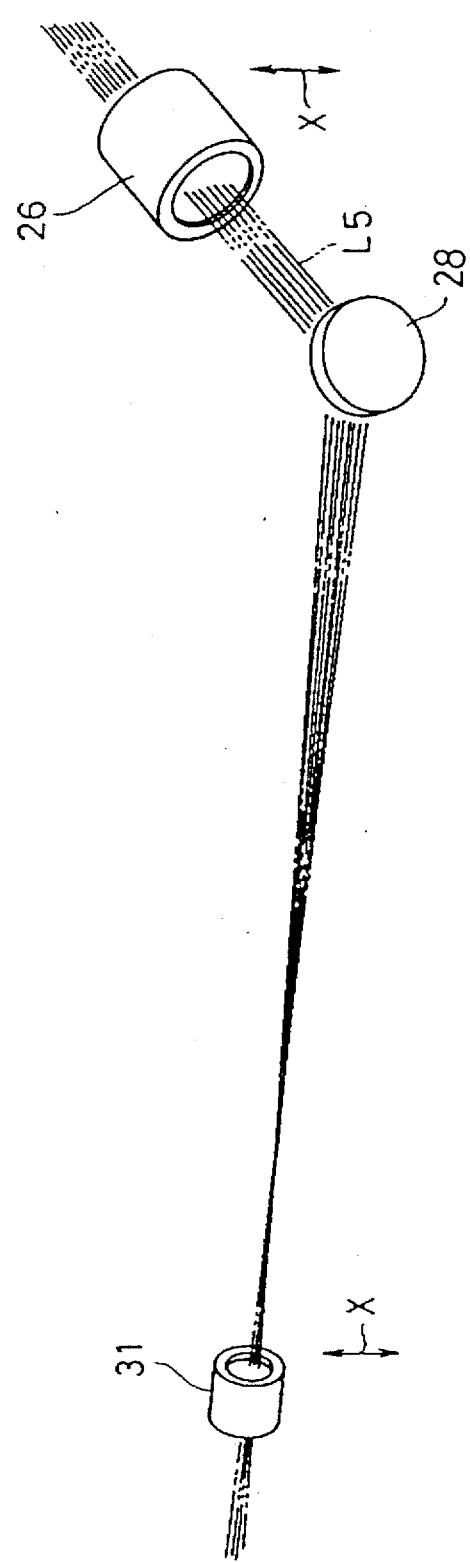
FIG. 10 is a perspective view of a pitch changing convergent optical system which constitutes the X-direction adjusting mechanism.

The X-direction adjusting mechanism 91 includes a stationary supporting wall 93 which projects upward from the base portion 92, and a movable supporting wall 94 which is movable in the vertical direction (i.e., direction X) in FIG. 9. The micrometer head 95 is mounted to the upper portion of the movable supporting wall 94 extending in the vertical direction. The movable supporting wall 94 is provided with a supporting hole 94a extending therethrough, in which the pitch changing convergent optical system 26 (31) is secured. The stationary supporting wall 93 is provided with a hole 93a in which an annular portion 26a (31a) of the pitch changing convergent optical system 26 (31) is movably inserted.

The hole 93a has a diameter larger than the diameter of the annular portion 26a (31a) so as to permit the latter to move therein through the movable supporting wall 94. The movable supporting wall 94 is biased by a biasing means (not shown) in the vertical direction to bias the pitch changing convergent optical system 26 (31) and the micrometer head 95 in the same direction. Consequently, the spindle 96 of the micrometer head 95 is pressed at the front end thereof against the upper portion of the stationary supporting wall 93. With the arrangement of the X-direction adjusting mechanism 91 as constructed above, the pitch changing convergent optical system 26 (31) can be slid and adjusted in the vertical direction (X-direction) through the movable supporting wall 94 when the spindle 96 is reciprocally moved by the micrometer head 95.

Figure 11:
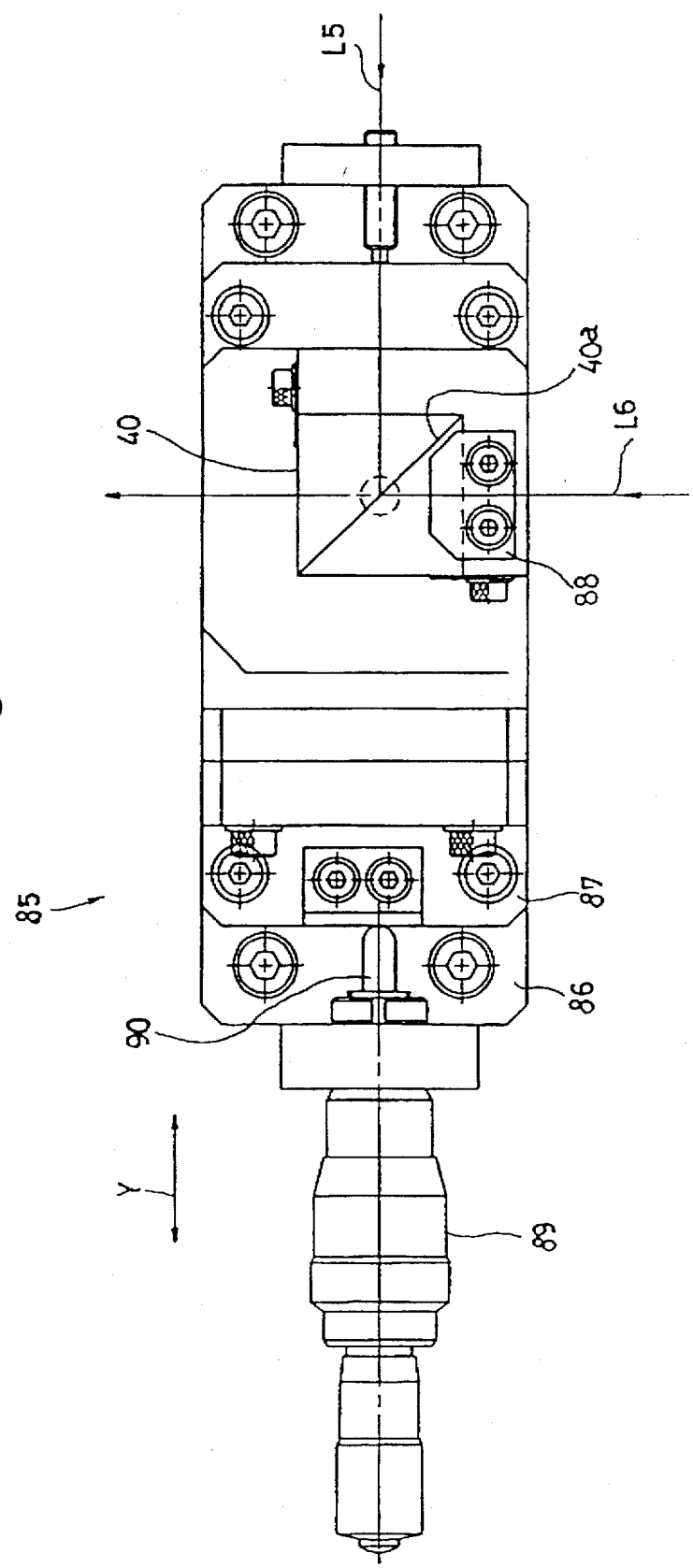
FIG. 11 is a plan view of an adjusting mechanism in a Y-axis direction (Y-direction adjusting mechanism)

The beam bender 38 and the polarization beam splitter 40 which constitute a Y-direction adjusting means are moved to move the first drawing beams L5 in the direction Y, i.e., toward the second drawing beams L6 (FIG. 17), to thereby adjust the positional relationship therebetween. The beam bender 38 is rotated about the pivot shaft 38a (FIG. 2) extending in the direction X to move and adjust the first drawing beams L5 in the direction Y. The polarization beam splitter 40 is supported by the Y-axis adjusting mechanism 85 (FIG. 11) so as to move in the direction Y.

Figure 12:
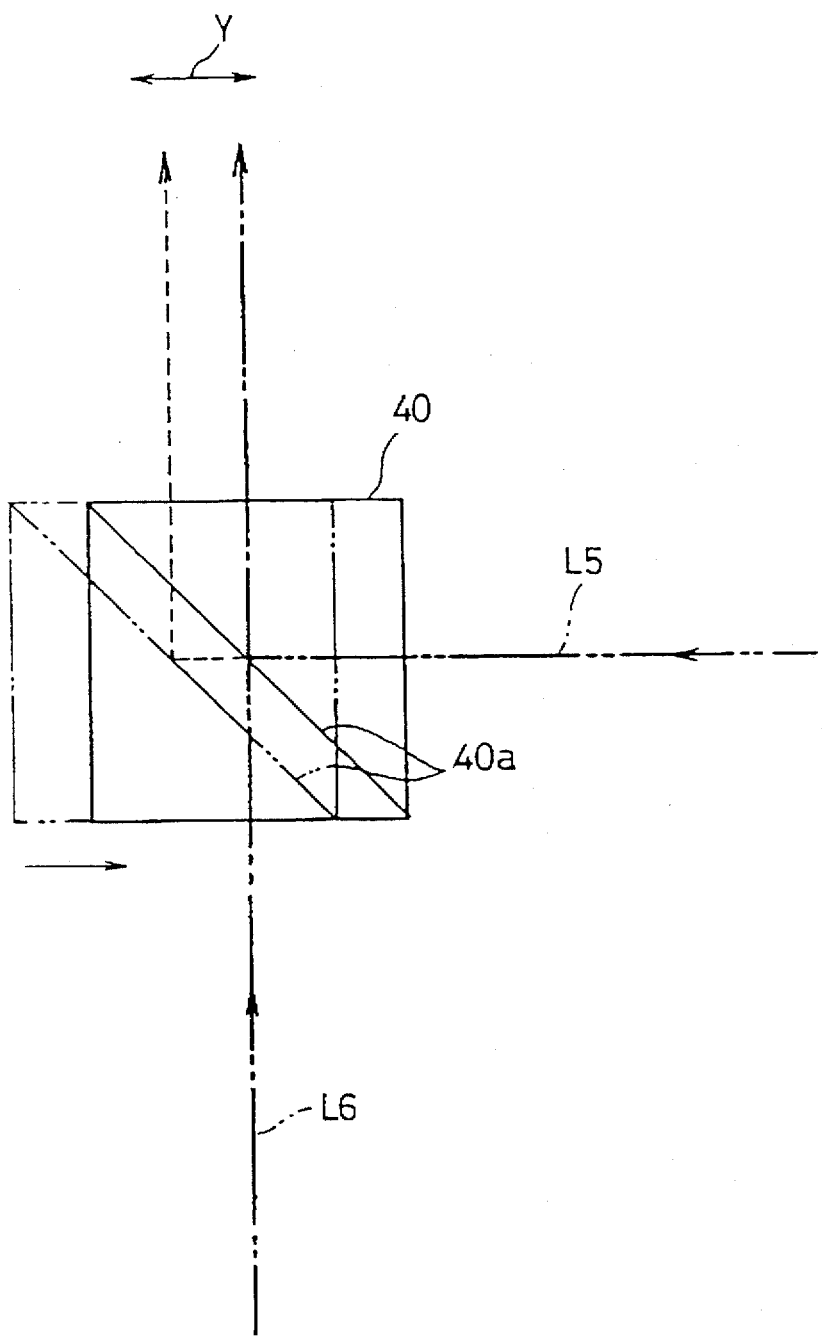
FIG. 12 is a plan view of a polarization beam splitter which is slid in the Y-axis direction by the Y-direction adjusting mechanism.

The Y-direction adjusting mechanism 85 includes a base portion 86 secured to the table 10 of the laser drawing apparatus 11, a movable portion 87 capable of moving in the direction Y with respect to the base portion 86, and a micrometer head 89 which is supported by the base portion 86 to extend in the direction Y. The polarization beam splitter 40 is secured to the movable portion 87, so that the half mirror surface 40a of the polarization beam splitter 40 is inclined at an angle of 45° with respect to the direction Y. The movable portion 87 is biased by a biasing means (not shown) toward the micrometer head 89 (i.e., the left direction in FIG. 11), so that one side surface thereof is pressed against the front end of the spindle 90 of the micrometer head 89. Consequently, when the spindle 90 is moved in the longitudinal direction thereof by the operation of the micrometer head 89, the polarization beam splitter 40 is moved in the direction Y to move and adjust the first drawing beams L5 in the direction Y (FIG. 12).

The polarization beam splitter 40 constitutes a beam combining means to alternately align the first group L5 of the aligned drawing beams deflected by the beam bender 38 and the second group L6 of the aligned drawing beams transmitted through the λ/2 plate 39 at a predetermined pitch in the direction X. The direction of polarization of the first drawing beams L5 is not changed in order to be deflected by 90° by the half mirror surface 40a. Then the direction of polarization of the second drawing beams L6 is changed by 90° with respect to the direction of polarization of the first drawing beams L5 through the λ/2 plate 39 in order to passe through the half mirror surface 40a. Hence, the drawing beams L5 and L6 having a difference of 90° in the direction of polarization are combined by the polarization beam splitter 40 to be alternately aligned along one line in the direction X.

The 8-channel acoustooptic modulators 36 and 37 function to eliminate the difference in the quantity of light between 8 first drawing beams L5 and 8 second drawing beams L6. The acoustooptic modulators 36 and 37 also function to independently control the drawing beams L5 and L6 split by the beam separators 21 and 22 through the control means 8 in accordance with predetermined data to thereby provide independent ON/OFF drawing data to the first and second drawing beams L5 and L6. The acoustooptic modulators 36 and 37 are each made of a crystal of tellurium dioxide, for example, which exhibits an acoustooptic effect that the refractive index of the crystal is slightly changed in proportion to the frequency of an ultrasonic wave to be applied to the crystal.

Figure 13:
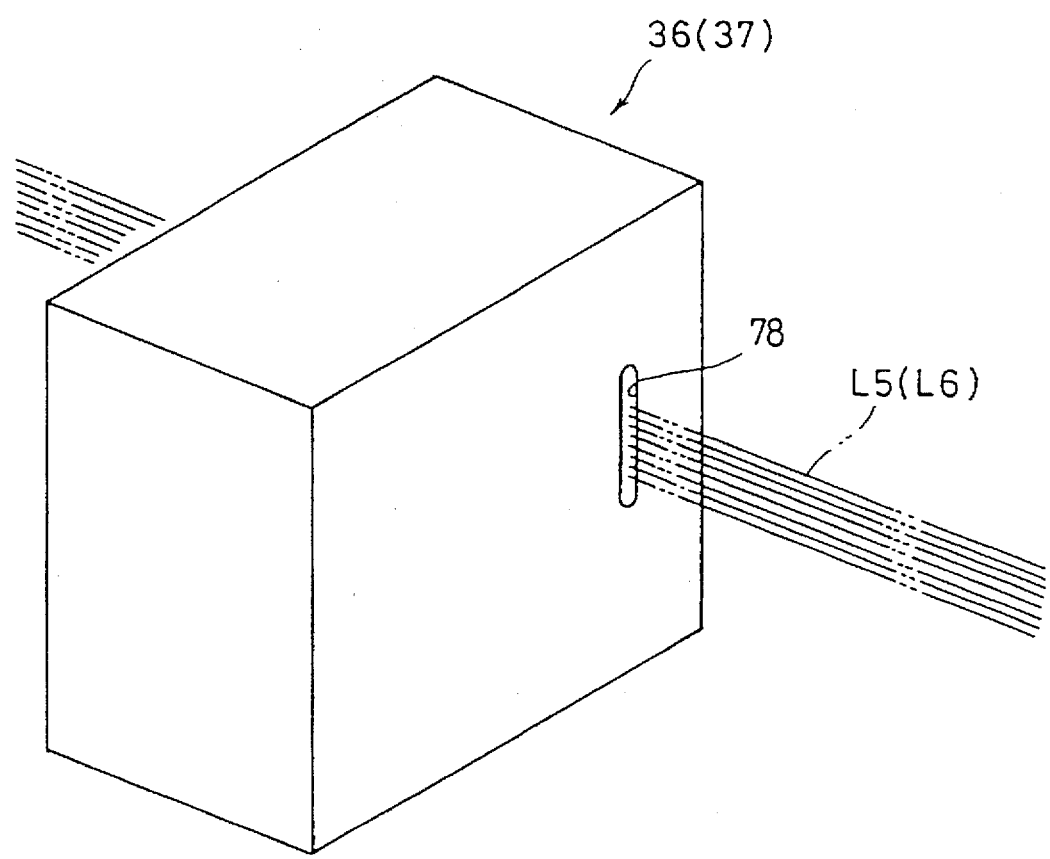
FIG. 13 is a perspective view of an acoustooptic modulator in a laser drawing apparatus shown in FIG. 1.

The acoustooptic modulators 36 and 37 generate a traveling-wave shape of ultrasonic wave within the crystal to thereby diffract the laser beam, when a high frequency electric field is applied to transducers provided at the opposed ends of the crystal. When a high frequency electric field is not applied to the transducers, the laser beam incident upon the crystal at a Bragg angle is transmitted through the acoustooptic modulators. Consequently, the ON/OFF control of the incident beams, i.e., the drawing beams L5 and L6 can be optionally and easily carried out by switching the application of the high frequency electric field to the acoustooptic modulators 36 and 37. Each of the acoustooptic modulators 36 and 37 has 8 channels aligned so as to receive the aligned drawing beams L5 (L6) and modulate the incident beams in the transverse direction (direction Y in FIG. 1). Moreover, the acoustooptic modulators 36 and 37 are each provided with a slit 78 (FIG. 13) elongated in the vertical direction (direction X in FIG. 1) so as to correspond to the 8 channels.

The monitoring beam Lm is independent from the beams L2 (L5) and L3 (L6) and has an optical path spaced from the optical paths of the drawing beams L5 and L6 at a predetermined distance. The monitoring beam Lm is deflected by the mirrors 54 and 25 and travels along an optical path spaced from the drawing beams L5 and L6 at a predetermined distance. Thereafter, the monitoring beam Lm is deflected by the mirrors 35 and 60 to come close to the drawing beams L5 and L6. Thereafter, the monitoring beam Lm passes along an optical path close to the optical paths of the drawing beams L5 and L6 through the lens 71, the beam bender 41 and the lens 52, etc.

The image rotator 43 is comprised of a mirror system which converges the 16 aligned beams of the drawing beams L5 and L6 onto the substrate S located at the drawing table surface T with a predetermined oblique angle, upon scanning by the polygonal mirror 46. Therefore, although the 16 beams of the first and second drawing beams L5 and L6 are aligned along one line in the main scanning direction (i.e., direction X) of the polygonal mirror 46 before they are made incident upon the image rotator 43, the 16 beams are rotated with respect to the direction X in the clockwise direction by a predetermined angle when emitted from the image rotator 43, as can be seen, for example, in FIG. 16.

The first and second drawing beams L5 and L6 and the monitoring beam Lm are deflected by the beam benders 44 and 45 and are thereafter made incident upon the reflecting surfaces 46a of the polygonal mirror 46. When the polygonal mirror 46 rotates about the rotating shaft 73 in the counterclockwise direction in FIG. 14, the deflection angle θ is continuously changed to move (i.e., scan) the first and second drawing beams L5 and L6 and the monitoring beam Lm through the reflecting surfaces 46a which rotate in the same direction. Consequently, the first and second drawing beams L5 and L6 are transmitted through the fθ lens 47 and the condenser lens 49, and converged onto the substrate S located at the table surface T. The rotating shaft 73 of the polygonal mirror 46 is supported by a supporting means (not shown) so that the inclination thereof in the sub-scanning direction Y can be displaced by an angle β. Hence, the perpendicularity of the main scanning line with respect to the sub-scanning line in the polygonal mirror 46 can be easily and optionally adjusted.

The fθ lens 47 contributes to an elimination of the problem that the position of the point image of the drawing beams on the scanning surface of the table surface T (FIG. 1) is not proportional to the deflection angle θ but is scanned at a higher scanning speed determined by tanθ at the upper portion of the scanning surface. The fθ lens 47 is comprised of a plurality of convex and concave lenses, wherein the image height of the point image on the scanning surface is proportional to the deflection angle θ defined by the reflected beam and the optical axis of the fθ lens, so that the drawing beams can be moved (i.e., scanned) at an equal scanning speed.

The monitoring beam Lm transmitted through the fθ lens 47 and the condenser lens 49 together with the first and second drawing beams L5 and L6 is successively reflected by the mirrors 51a and 51b to change the direction thereof by 180° and is made incident upon the X-scale 50 located at a position equivalent to the image forming surface of the table surface T. The X-scale 50 is made of a glass plate provided with a slit(s) to function as a linear encoder. The monitoring beam Lm transmitted through the X-scale 50 is reflected and converged by elongated mirrors 63 and 64, and is then converged by the condenser lens 48 for the X-scale to be made incident upon the photo-detector 62 for the X-scale. When the positions of the 16 beams of the first and second drawing beams L5 and L6 are detected in accordance with the position of the monitoring beam Lm detected by the photo-detector 62, the control signal is sent from the control means 8 (e.g., micro computer) in accordance with the detection data thus obtained. Consequently, the 16 beams of the first and second drawing beams L5 and L6 are independently controlled (i.e., turned ON and OFF) in accordance with the control signal.

Figure 21:
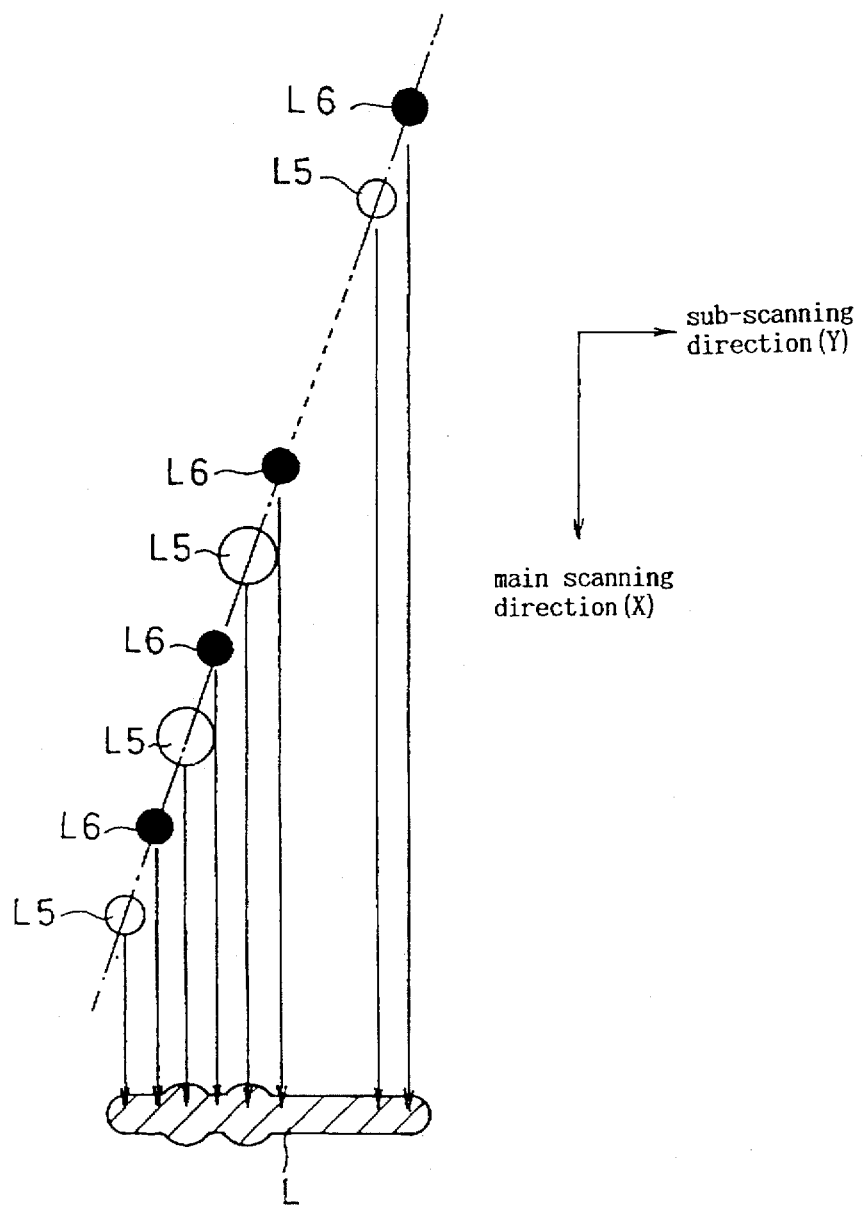
FIG. 21 is an explanatory view of a row of drawing beams and a line drawn by the drawing beams, before an amendment is carried out.
Figure 22:
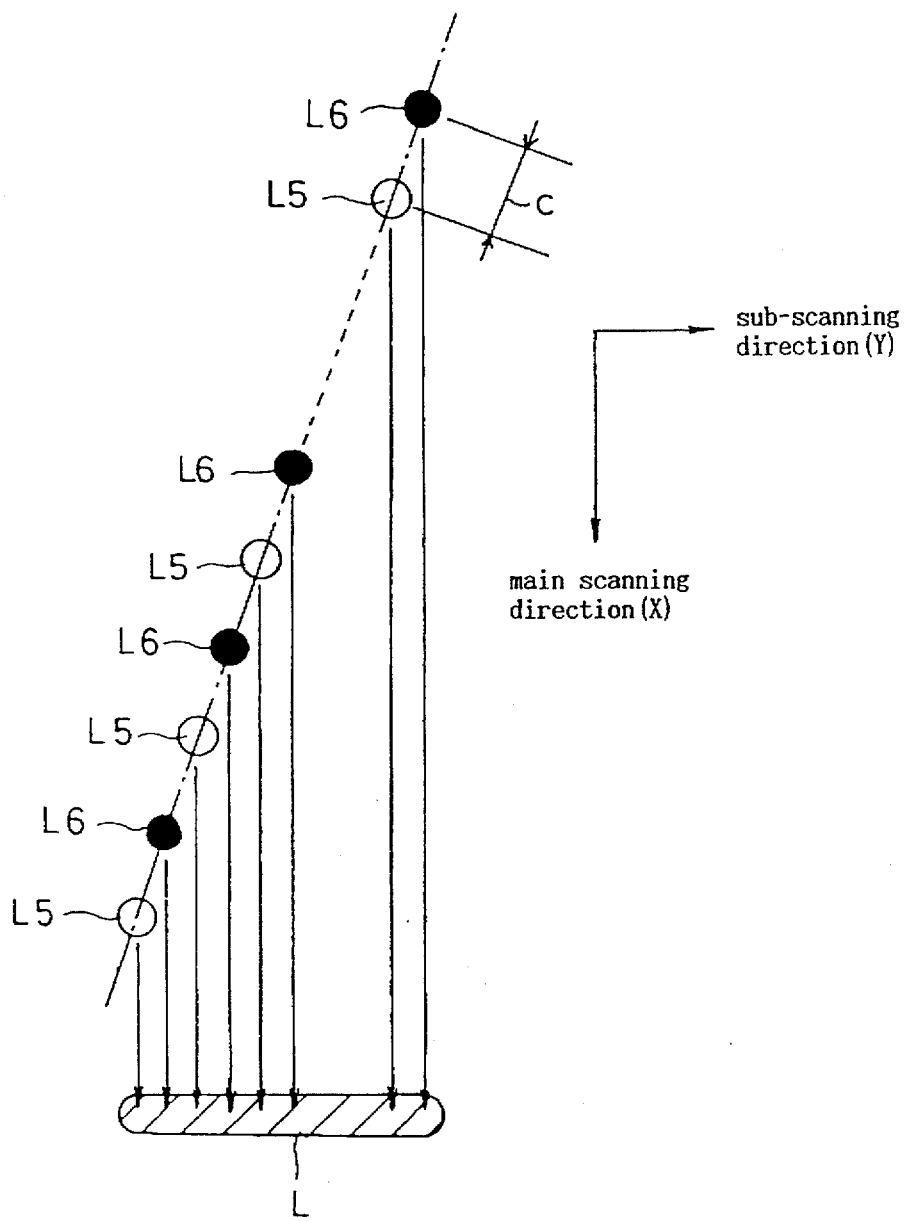
FIG. 22 is an explanatory view of a row of drawing beams and a line drawn by the drawing beams, after an amendment is completed.

The beam spots of the first and second drawing beams L5 and L6 which are made incident upon the drawing table surface T at a slightly oblique angle are adjusted through the acoustooptic modulators 36 and 37 each having 8 channels so that the each spot diameter is for example 30 μm. Consequently, the irregularity in quantity(power) of the beam among the beam spots, as shown in FIG. 21 can be eliminated, as can be seen in FIG. 22. In the illustrated embodiment, the pitch of the beam spots, i.e., the distance "b" (FIG. 19) between the adjacent spots is adjusted to be for example 5 μm through the acoustooptic modulators 36 and 37.

Figure 19:
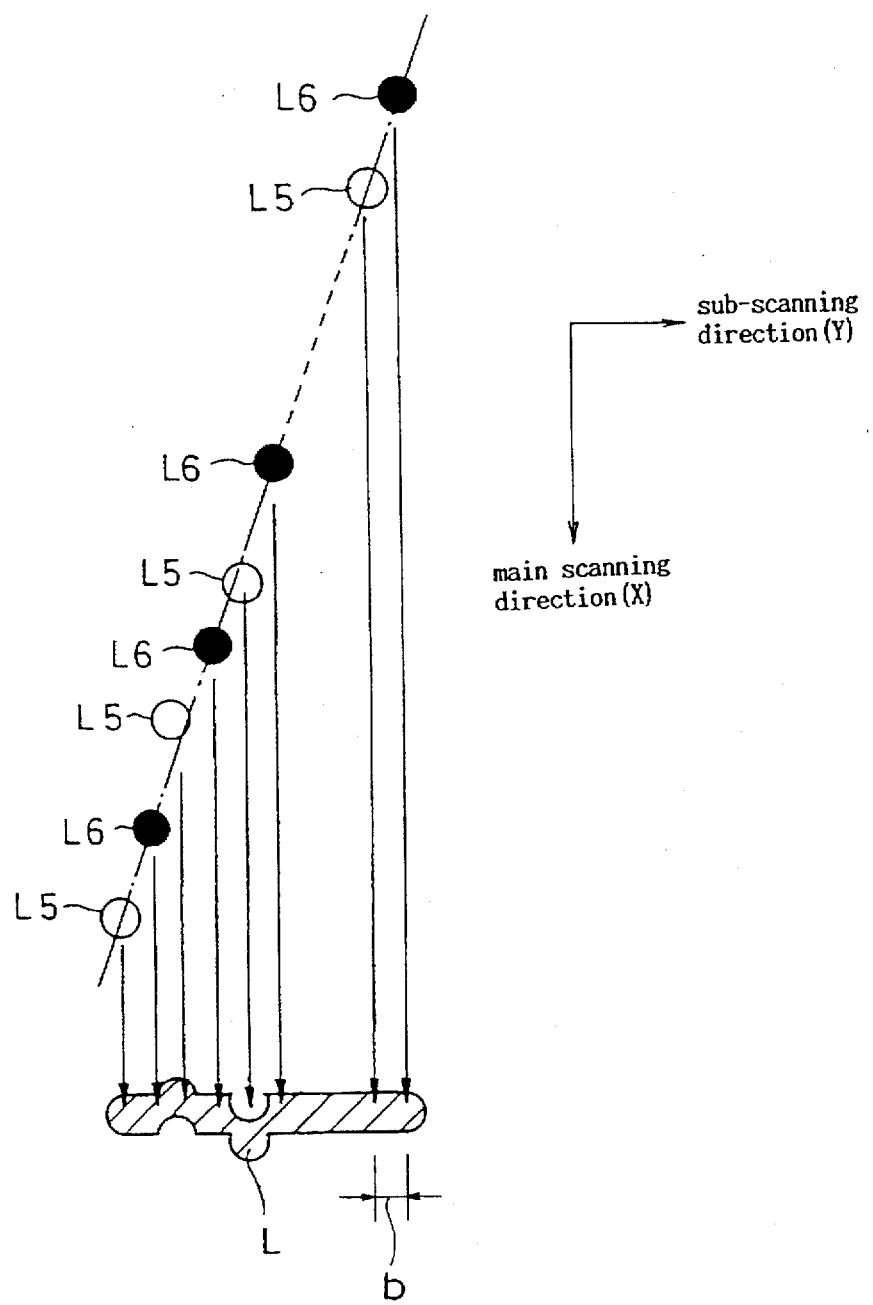
FIG. 19 is an explanatory view of a row of drawing beam and a line drawn by the drawing beam, before an amendment is carried out.
Figure 20:
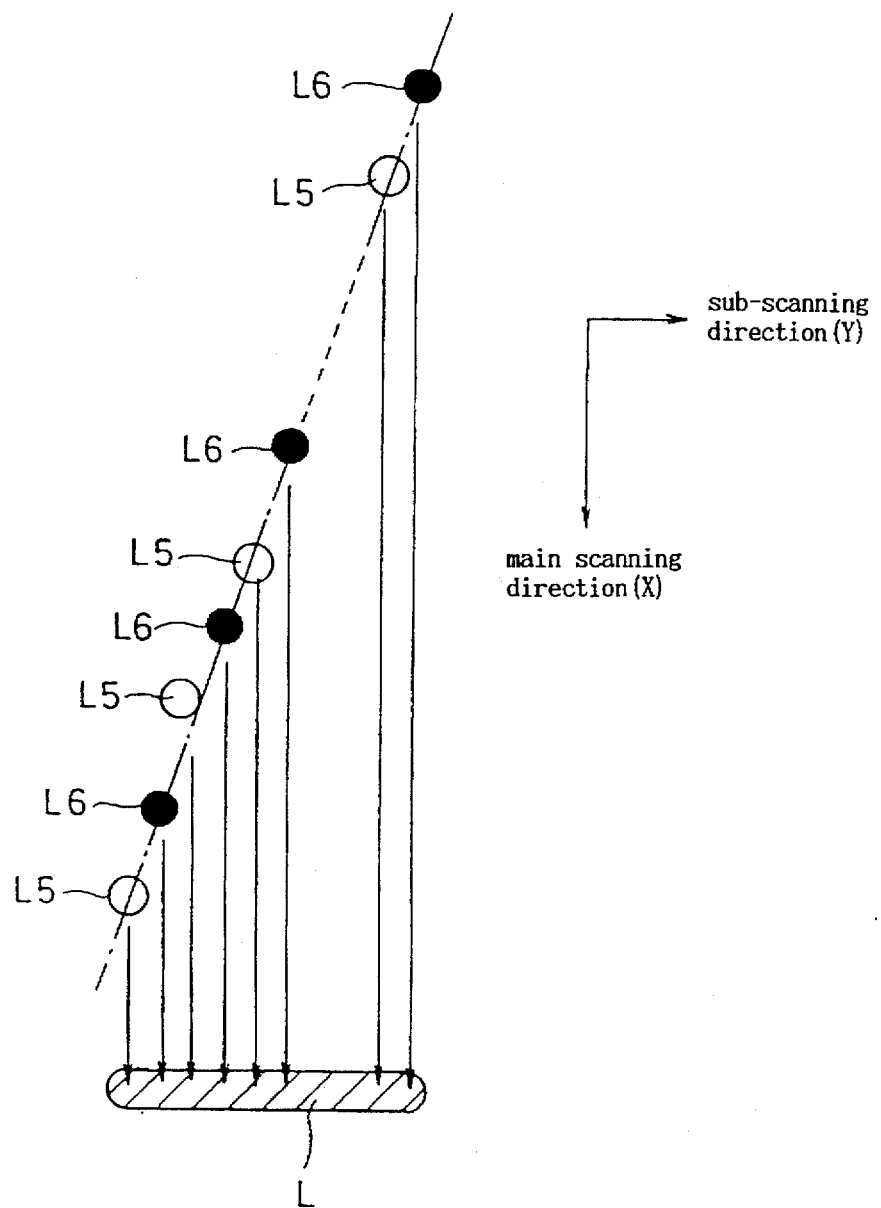
FIG. 20 is an explanatory view of a row of drawing beams and a line drawn by the drawing beams, after an amendment is completed.

The line L (FIGS. 19 through 22) drawn with the beam spots aligned along the sub-scanning direction is formed by appropriately turning ON and OFF the acoustooptic modulators 36 and 37. Upon drawing the line L, it is necessary to provide a space "c" (FIG. 22) between the adjacent beam spots of the drawing beams L5 and L6 in order to prevent an interference therebetween. For example, if the exposure by the drawing beam L6 adjacent to the lowermost drawing beam L5 takes place immediately after the completion of the exposure by the lowermost drawing beam L5 in FIG. 22, a straight drawing line L is not obtained. To this end, in the laser drawing apparatus 11 according to the present invention, the control means 8 retards the exposure of the subsequent drawing beam L5 by a predetermined delay time. Consequently, the subsequent beam spot of the second drawing beam L6 can be properly superimposed on the preceding beam spot of the first drawing beam L5 that has been exposed. The straight line L, as shown in FIG. 22, can be formed by repeating the control process as mentioned above. In the control operation, if the line L is not straight due to the irregularity in the position of the beam spots, as shown in FIG. 19, the modulation timing of the acoustooptic modulators 36 and 37 is varied in accordance with the control signal issued from the control means 8 to correct the drawing line L, as shown in FIG. 20.

Figure 15:
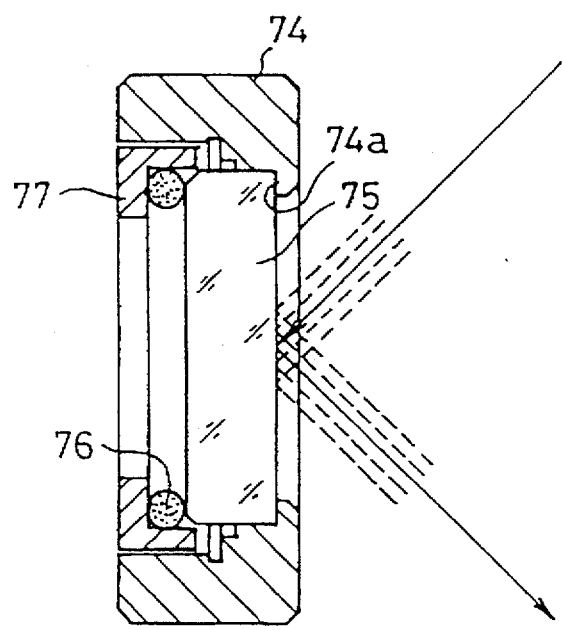
FIG. 15 is a sectional view of a beam bender used in a laser drawing apparatus according to the present invention.

The beam benders 13, 14, 23 through 25, 28 through 30, 35, 38, 41, 44, 45 and 54 are respectively provided with annular mirror supporting members 74. Each mirror supporting member 74 is provided on the front surface (right side in FIG. 15) thereof with an inner peripheral flange 74a which constitutes an abutting surface, as shown in FIG. 15. The mirror 75 which is fitted in the mirror supporting member 74 abuts against the rear surface of the inner peripheral flange 74a. A keep ring 77 is screwed in the mirror supporting member 74 through an annular shock absorbing member 76. Consequently, not only can the mirror 75 be easily exchanged, but also the mirror 75 can be always positioned at a reference position.

Figure 4:
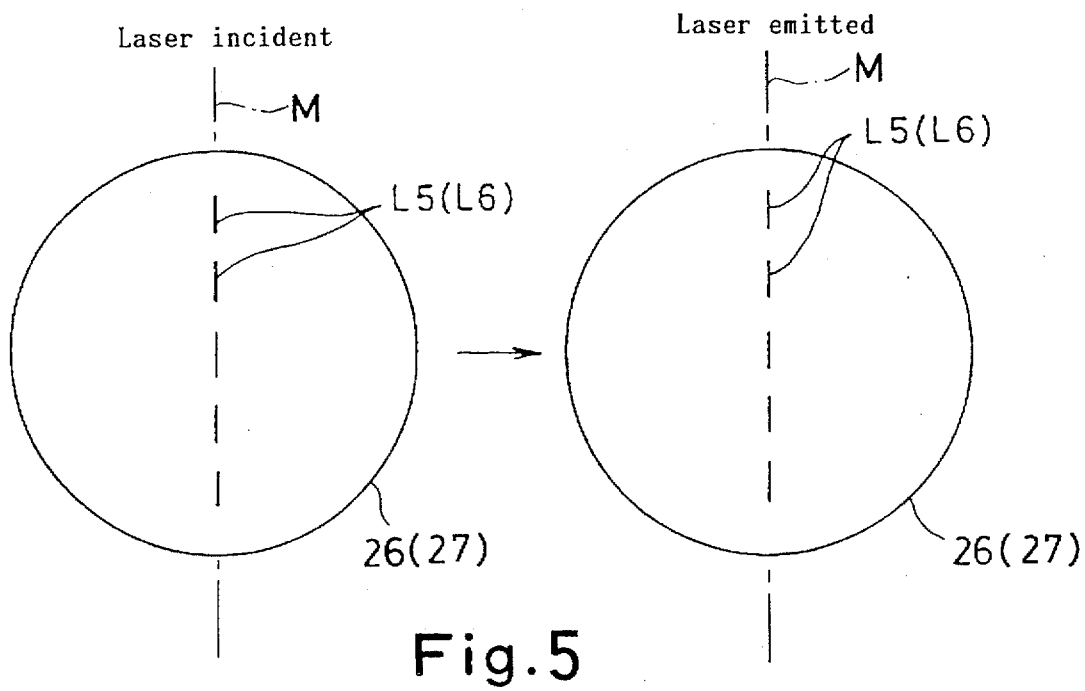
FIG. 4 shows explanatory views of a pitch changing convergent optical system of drawing beams in a laser drawing apparatus shown in FIG. 1, when the laser light is made incident thereon and emitted therefrom, respectively.
Figure 5:
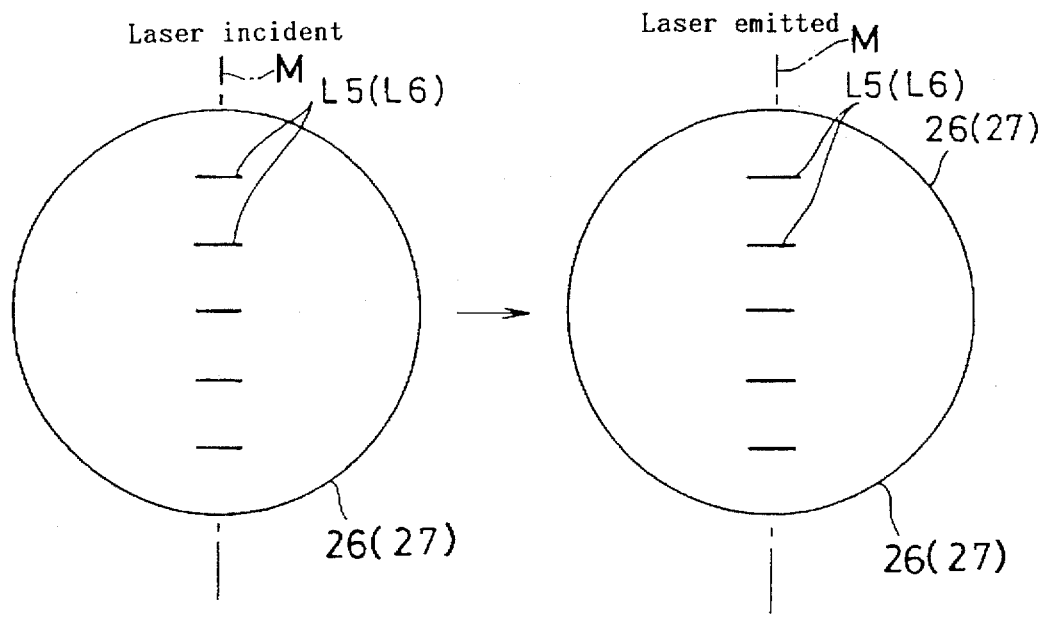
FIG. 5 shows explanatory views of a pitch changing convergent optical system of drawing beams in a laser drawing apparatus shown in FIG. 1, when the laser light is made incident thereon and emitted therefrom, respectively.

The Ar laser 12 and the beam separators 21 and 22 align the respective first and second drawing beams L5 and L6 emitted from the beam separators 21 and 22 on the respective meridians of the pitch changing condenser lenses 26 and 27. Moreover, the Ar laser 12 and the beam separators 21 and 22 are correctly positioned such that the direction of oscillation of the drawing beams L5 and L6 upon incidence is parallel with or normal to the meridian M of the respective condenser lenses 26 and 27 (FIGS. 4 and 5).

The laser drawing apparatus 11 according to the present invention operates as follows.

First of all, the substrate S on which the circuit pattern is to be formed is set at an appropriate position in which the positioning hole (not shown) of the substrate is registered with the corresponding portion of the substrate setting apparatus (not shown). When the substrate S is set in the reference position, the substrate S is movable in the direction Y and swingable about the pivot shaft (not shown) by the Y-table and the swing mechanism (not shown) of the substrate setting apparatus.

In this state, the Ar laser 12 is activated to emit the laser beam L1. Consequently, the laser beam L1 is deflected by the beam bender 13; transmitted through the adjusting target 15; and made incident upon the half prism 16 in which the laser beam is split into the beam L2 which runs straight and the drawing beam deflected by 90° toward the half mirror 14. The deflected beam is then split by the half mirror 14 into the drawing beam L3 which is deflected by 90° to run parallel to the second beam L2 and the monitoring beam Lm which is made incident upon the mirror 54 wherein the monitoring beam Lm is deflected by 90°.

The beam L2 is made incident upon the acoustooptic modulator 19 through the lens 65, the adjusting target 17 and the lens 67; and the beam L3 is transmitted through the lenses 66 and 68 and made incident upon the acoustooptic modulator 20. The difference in the quantity of light between the beams L2 and L3 is eliminated by the acoustooptic modulators 19 and 20. The beam L2 and L3 are split into the 8 first drawing beams L5 and the 8 second drawing beams L6 that are in parallel with the first drawing beams L5 in the direction X by the beam separators 21 and 22, respectively. The first and second drawing beams L5 and L6 are transmitted through the pitch changing convergent optical systems 26 and 27; deflected by 90° through the beam benders 28 and 29; and, made incident upon the acoustooptic modulators 36 and 37 through the pitch changing convergent optical systems 31 and 32, respectively.

Figure 23:
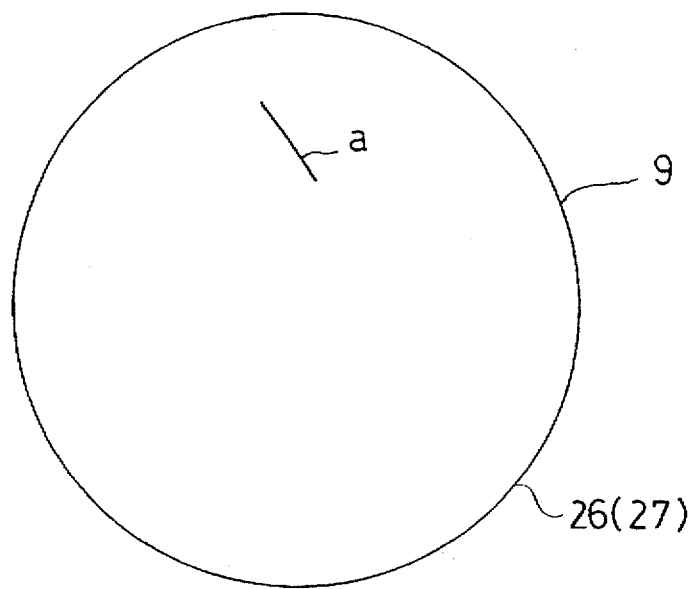
FIG. 23 is an explanatory view of a drawback which is caused when the light whose direction of oscillation is inclined is incident upon a lens.
Figure 24:
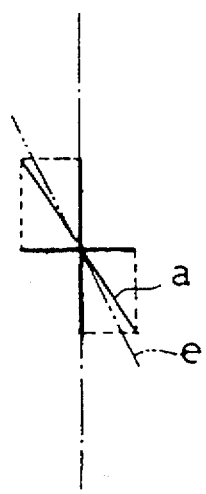
FIG. 24 is an explanatory view of a drawback which is caused when the light whose direction of oscillation is inclined is incident upon a lens.

Among the split beams L5 and L6 incident upon the pitch changing condenser lenses 26 and 27, the portion thereof passing through the center axis of the condenser lenses 26 and 27 has no problem to be solved, but the portion passing through the portion of the condenser lenses other than the optical axis has the following problem, depending on the direction of polarization thereof. Namely, the off-axis beams which are incident upon the lens surfaces of the condenser lenses 26 and 27 at an incident angle other than zero. Accordingly, there is a difference in reflectance between the P-polarized light component and the S-polarized light component. Consequently, as can be seen in FIG. 23, when the off-axis beam "a", whose direction of oscillation is rotated, is incident upon the condenser lenses 26 and 27, there is a difference in transmittance between the P-polarized light component and the S-polarized light component, due to the difference in reflectance of the lens therebetween and the difference in direction of polarization therebetween, as shown in FIG. 24. As a result, the direction of oscillation of the resultant off-axis beam "a" having the P-polarized light component and the S-polarized light component is twisted or deviated when they are emitted from the condenser lenses 26 and 27, as if the direction of polarization is rotated, as indicated by a two-dotted and dashed line "e" in FIG. 24.

Figure 25:
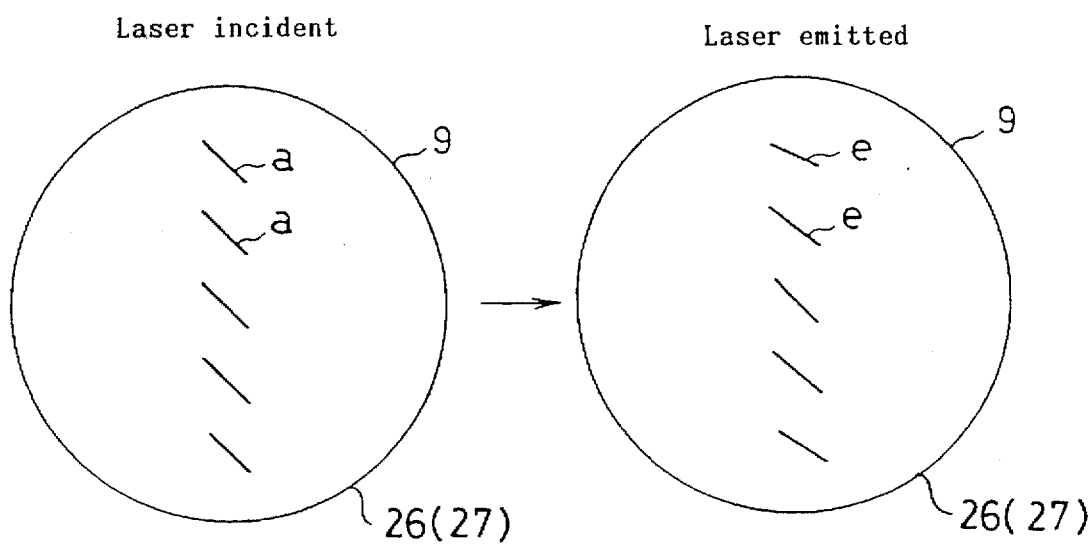
FIG. 25 shows an explanatory view of a drawback which is caused when the light whose direction of oscillation is inclined is incident upon a lens; and, FIG. 26 shows an explanatory view of a drawback which is caused when the light whose direction of oscillation is inclined is incident upon a lens.
Figure 26:
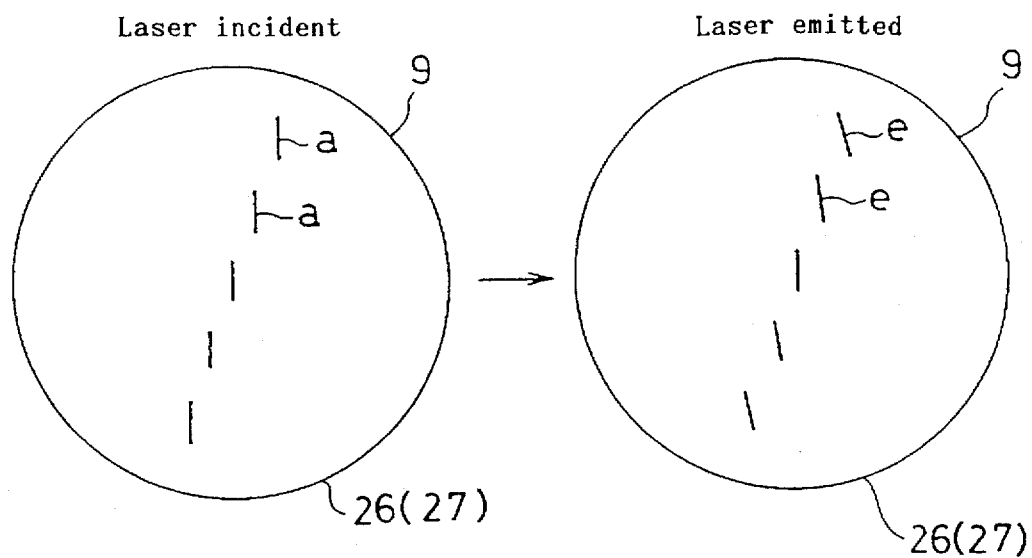

As mentioned above, when a plurality of bundles of beams are transmitted through the pitch changing condenser lenses 26 and 27, if the direction of polarization thereof is rotated (FIGS. 25 and 26), the quantity of light emitted from the condenser lenses and received for example by the polarization beam splitter 40 may be reduced. Furthermore, if the beams transmitted through the condenser lenses 26 and 27 are made incident upon the acoustooptic modulators 36 and 37, there is a possibility that the emitted beams having different directions of polarization are diffracted by the acoustooptic modulators 36 and 37 at different diffraction efficiencies.

As mentioned above, in the laser drawing apparatus 11 according to the present invention, the Ar laser 12 and the beam separators 21 and 22 are arranged such that the bundles of drawing beams L5 and L6 emitted from the beam separators 21 and 22 are aligned on the meridian M (line including the optical axis) of the respective pitch changing condenser lenses 26 and 27, as shown in FIGS. 4 and 5. Moreover, the laser light emitted from the Ar laser 12 is linearly polarized light and is split by the half prism 16 into the linearly polarized split beams L5 and L6 to be made incident upon the beam separators 21 and 22, respectively. The direction of oscillation of the split beams L5 and L6 incident upon the condenser lenses 26 and 27 is parallel with or normal to the meridian "M" of the condenser lenses 26 and 27 by the arrangement of the Ar laser 12 and the beam separators 21 and 22, as shown in FIGS. 4 and 5. Consequently, no quantity of the split beams L5 and L6 transmitted through the condenser lenses 26 and 27 and received by the polarization beam splitter 40 is reduced. In addition to the foregoing, there is no difference in the diffraction efficiency of the split beams by the acoustooptic modulators 36 and 37, which would be otherwise caused by the difference of the polarization state when the split beams L5 and L6 transmitted through the condenser lenses 26 and 27 are made incident upon the acoustooptic modulators 36 and 37.

The drawing beams L5 and L6 transmitted through the pitch changing condenser lenses 26 and 31 are deflected by 90° by the beam benders 28 and 29, and are made incident upon the acoustooptic modulators 36 and 37 through the condenser lenses 31 and 32. The difference in the quantity of light between the drawing beams L5 and L6 that are respectively split into 8 beams is eliminated by the acoustooptic effect of the acoustooptic modulators 36 and 37, each having 8 channels. The emission of the drawing beams L5 and L6 is controlled by the control means 8 which selectively applies the high frequency electric field to the acoustooptic modulators 36 and 37.

The drawing beams L5 emitted from the acoustooptic modulator 36 is deflected by 90° through the beam bender 38 and made incident upon the polarization beam splitter 40. The drawing beams L6 emitted from the acoustooptic modulator 37 is transmitted through the λ/2 plate 39 wherein the direction of polarization thereof is changed, and made incident upon the polarization beam splitter 40. The drawing beams L5 and L6, each having 8 beams are successively combined by the polarization beam splitter 40, so that the 16 beams are aligned along one line in the direction X.

The control means 8 actuates the substrate setting apparatus (not shown) in synchronization with the scanning operation of the drawing beams L5 and L6 by the polygonal mirror 46 to slide the substrate S on the drawing table surface T in the direction Y. Consequently, a two-dimensional predetermined circuit pattern is formed (i.e., drawn or exposed) on the substrate S by the 16 beams of the drawing beams L5 and L6 that are selectively emitted in a slightly oblique angle with respect to the direction X. The drawing speed is theoretically 16 times the drawing speed at which a circuit pattern is drawn by one drawing beam.

As can be understood from the foregoing, according to the present invention, the laser source and the splitting means is constructed to split the laser light emitted from the laser source into a plurality of beam groups aligned on the meridian of the lens, and the laser light is linearly polarized light when it is made incident upon the lens. Furthermore, the direction of oscillation of the respective split beams is parallel with or normal to the meridian of the lens. Consequently, not only can the direction of oscillation of the split beams emitted from the lens be appropriately specified, but also the quantity of light transmitted through the lens does not decrease.

Although the invention has been described with reference to particular means, materials and embodiments, it is to be understood that the invention is not limited to the particulars disclosed and extends to all equivalents within the scope of the claims.

I claim:

1. A laser drawing apparatus comprising;

a laser source;

a table, a splitting means for splitting laser light emitted from said laser source into groups of drawing beams, the drawing beams being aligned in a common plane;

a lens to which said drawing beams are made incident upon; and, a scanning means for scanning a drawing surface with said drawing beams passed through said lens in a main scanning direction;

wherein said splitting means is disposed with respect to said laser source so that said common plane is aligned along a meridian of said lens, and each of said drawing beams is made incident upon said lens as linearly polarized light having a direction of oscillation which is parallel with or normal to said meridian of said lens.

2. The laser drawing apparatus of claim 1, wherein said splitting means comprises a beam splitter which separates said laser light into two beams and a beam separator which separates each of two beams into two groups of drawing beams, each of said two groups of drawing beams being aligned in a common plane.

3. The laser drawing apparatus of claim 2, wherein said beam separator is swingably supported on said support about an axis extending parallel to the drawing beams in said common plane.

4. The laser drawing apparatus of claim 1, further comprises an acoustooptic modulator which independently controls said emission of said groups of drawing beams transmitted through said lens and incident on said acoustooptic modulator in accordance with predetermined data to provide ON/OFF drawing data to said respective groups of drawing beams.

5. The laser drawing apparatus of claim 4, wherein said lens are arranged along an optical path of said drawing beams and receive said drawing beams, and said lens comprises an adjusting means for moving said pitch of said drawing beams to match a pitch of said acoustooptic modulator.

6. The laser drawing apparatus of claim 5, wherein said adjusting means comprises a base portion secured to a table of the laser drawing apparatus, and a movable portion connected to the base and movable with respect to the base portion, said movable portion supporting the lens.

* * * * *

UNITED STATES PATENT AND TRADEMARK OFFICE
CERTIFICATE OF CORRECTION

PATENT NO. : 5,745,150
DATED : April 28, 1998
INVENTOR(S) : Takashi Iizuka

It is certified that error appears in the above-indentified patent and that said Letters Patent is hereby corrected as shown below:

Title page, item [54] and col. 1, correct the title to read as follows:

LASER DRAWING APPARATUS HAVING DRAWING BEAMS IN A COMMON PLANE ALIGNED WITH A LENS MERIDIAN

Signed and Sealed this

Twenty-fifth Day of August, 1998

Attest:

BRUCE LEHMAN

Attesting Officer

Commissioner of Patents and Trademarks